(12) United States Patent
Colinge et al.

(10) Patent No.: US 9,368,619 B2
(45) Date of Patent: Jun. 14, 2016

(54) METHOD FOR INDUCING STRAIN IN VERTICAL SEMICONDUCTOR COLUMNS

(71) Applicant: Taiwan Semiconductor Manufacturing Company, Ltd., Hsin-Chu (TW)

(72) Inventors: Jean-Pierre Colinge, Hsin-Chu (TW); Gwan Sin Chang, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 104 days.

(21) Appl. No.: 13/763,110

(22) Filed: Feb. 8, 2013

(65) Prior Publication Data

US 2014/0225184 A1    Aug. 14, 2014

(51) Int. Cl.
*H01L 29/78*    (2006.01)
*H01L 29/06*    (2006.01)

(52) U.S. Cl.
CPC ........ *H01L 29/7827* (2013.01); *H01L 29/0676* (2013.01); *H01L 29/7843* (2013.01)

(58) Field of Classification Search
CPC  B82Y 10/00; H01L 29/0665; H01L 29/0676; H01L 29/41741; H01L 29/7926; H01L 27/11565; H01L 29/66666; H01L 29/7889; H01L 29/7827
USPC .............. 257/413, 9, E21.652, 655; 438/761, 438/258, 585, 268, 405, 198
See application file for complete search history.

(56) References Cited

U.S. PATENT DOCUMENTS 7,667,271 B2    2/2010  Yu et al.
7,736,979 B2    6/2010  Farrow et al.
(Continued)

FOREIGN PATENT DOCUMENTS

JP    2009239167    10/2009
KR   20060012724    2/2006
(Continued)

OTHER PUBLICATIONS

Cho, H.-J. et al., "Investigation of Gate Etch Damage at Metal/High-k Gate Dielectric Stack Through Random Telegraph Noise in Gate Edge Direct Tunneling Current," IEEE Electron Device Letters, vol. 32, No. 4, Apr. 2011, pp. 569-571.
(Continued)

*Primary Examiner* — Kenneth Parker
*Assistant Examiner* — Bo Fan
(74) *Attorney, Agent, or Firm* — Slater Matsil, LLP

(57) ABSTRACT

A vertical Metal-Oxide-Semiconductor (MOS) transistor includes a substrate and a nano-wire over the substrate. The nano-wire comprises a semiconductor material. An oxide ring extends from an outer sidewall of the nano-wire into the nano-wire, with a center portion of the nano-wire encircled by the oxide ring. The vertical MOS transistor further includes a gate dielectric encircling a portion of the nano-wire, a gate electrode encircling the gate dielectric, a first source/drain region underlying the gate electrode, and a second source/drain region overlying the gate electrode. The second source/drain region extends into the center portion of the nano-wire. Localized oxidation produces a local swelling in the structure that generates a tensile or compressive strain in the nano-wire.

19 Claims, 19 Drawing Sheets

(56) References Cited

U.S. PATENT DOCUMENTS

| | | | |
|---|---|---|---|
| 7,759,729 | B2 | 7/2010 | Bjoerk et al. |
| 8,076,231 | B2* | 12/2011 | Saitoh ............. H01L 21/823821 257/347 |
| 8,093,664 | B2 | 1/2012 | Gomikawa et al. |
| 8,164,146 | B2* | 4/2012 | Lung ...................... B82Y 10/00 257/413 |
| 8,319,316 | B2 | 11/2012 | Kutsukake et al. |
| 8,362,575 | B2 | 1/2013 | Kwok et al. |
| 8,367,498 | B2 | 2/2013 | Chang et al. |
| 8,395,197 | B2 | 3/2013 | Nagai |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,633,075 | B2 | 1/2014 | Shima |
| 8,653,570 | B2 | 2/2014 | Konishi |
| 8,680,576 | B2 | 3/2014 | Ching et al. |
| 8,716,774 | B2 | 5/2014 | Mikasa |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,772,771 | B2 | 7/2014 | Tanaka |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,999,805 | B1 | 4/2015 | Colinge et al. |
| 2005/0227425 | A1* | 10/2005 | Henley ................ H01L 29/045 438/198 |
| 2005/0255667 | A1* | 11/2005 | Arghavani .......... H01L 29/6656 438/405 |
| 2007/0284623 | A1 | 12/2007 | Kim et al. |
| 2008/0197418 | A1 | 8/2008 | Parthasarathy et al. |
| 2009/0020764 | A1 | 1/2009 | Anderson et al. |
| 2009/0215277 | A1* | 8/2009 | Lee ................. H01L 21/823807 438/761 |
| 2009/0242990 | A1 | 10/2009 | Saitoh et al. |
| 2010/0019276 | A1 | 1/2010 | Jang |
| 2010/0176459 | A1 | 7/2010 | Wernersson et al. |
| 2010/0210096 | A1 | 8/2010 | Masuoka et al. |
| 2010/0301402 | A1 | 12/2010 | Masuoka et al. |
| 2011/0294295 | A1 | 12/2011 | Zhu et al. |
| 2011/0303985 | A1 | 12/2011 | Masuoka et al. |
| 2012/0018704 | A1* | 1/2012 | Wallis .................... B82Y 10/00 257/24 |
| 2012/0025169 | A1 | 2/2012 | Mars et al. |
| 2012/0061838 | A1* | 3/2012 | Edelstein .......... H01L 21/76832 257/751 |
| 2012/0223288 | A1* | 9/2012 | Kim ....................... B82Y 10/00 257/9 |
| 2012/0295074 | A1 | 11/2012 | Yi et al. |
| 2013/0011983 | A1 | 1/2013 | Tsai et al. |
| 2013/0341702 | A1 | 12/2013 | Kar et al. |
| 2014/0166981 | A1 | 6/2014 | Doyle et al. |
| 2014/0252412 | A1 | 9/2014 | Tsai et al. |
| 2014/0332859 | A1 | 11/2014 | Colinge et al. |
| 2015/0048441 | A1 | 2/2015 | Colinge et al. |
| 2015/0069475 | A1 | 3/2015 | Colinge et al. |

FOREIGN PATENT DOCUMENTS

| | | |
|---|---|---|
| KR | 100712552 | 4/2007 |
| KR | 100771871 | 11/2007 |

OTHER PUBLICATIONS

Chu, M., et al., "Strain: A Solution for Higher Carrier Mobility in Nanoscale MOSFETs," Annual Reviews, vol. 39, May 2009, 12 pages.

Ferain, I. et al., "Multigate transistors as the future of classicla metal-oxide-semiconductor field-effect transistors," Nature, vol. 479, Nov. 17, 2011, pp. 2-8.

Flachowsky, S., et al., "Understanding Strain-Induced Drive-Current Enhancement in Strained-Silicon n-MOSFET and p-MOSFET," IEEE Transactions on Electron Devices, vol. 57, No. 6, Jun. 2010, pp. 1343-1354.

Gandhi, R. et al., "Vertical Si-Nanowire n-Type Tunneling FETs With Low Subthreshold Swing (<50 mV/decade) at Room Temperature," IEEE Electron Device Letters, vol. 32, No. 4, Apr. 2011, pp. 437-439.

Hashemi, P., et al., "Gate-All-Around n-MOSFETs Wtih Uniaxial Tensile Strain-Induced Performance Enhancement Scalable to Sub-10-nm Nanowire Diameter," IEEE Electron Device Letters, vol. 30, Issue 4, Apr. 2009, pp. 401-403.

Ionescu, A.M. et al., "Tunnel field-effect transistors as energy-efficient electronic switches," Review, doi: 10.1038/nature10679, Nature, vol. 479 Nov. 17, 2011, pp. 329-337.

Kim, K., "Future Silicon Technology," 2012 Proceedings of the European Solid State Device Research Conference, pp. 1-6.

Kwong, D.-L. et al., "Vertical Silicon Nanowire Platform for Low Power Electronics and Clean Energy Applications," Hindawi Publishing Corporation, Jopurnal of Nanotechnology, vol. 2012, Article ID 492121, pp. 1-21.

Larrieu, G. et al., "Vertical nanowire array-based field effect transistors for ultimate scaling," The Royal Society of Chemistry, Jan. 2013, pp. 2437-2441.

Liang, J. et al., "Relaxation of compressed eleastic islands on a viscous layer," Pergamon, www.actamat-journals.com, Acta Materialia 50 (2002) 2933-2944.

Maheshwaram, S., et al., "Device Circuit Co-Design Issues in Vertical Nanowire CMOS Platform," IEEE Electron Device Letters, vol. 33, Issue 7, Jul. 2012, pp. 934-936.

Niquet, Y.-M. et al., "Carrier Mobility in strained Ge nanowires," Journal of Applied Physics 112, 084301 (2012), pp. 084301-1-084301-4.

Peterson, R.L. et al., "Comment on 'Fabrication of Strained Silicon on Insulator by Strain Transfer Process' [Appl. Phys. Lett. 87, 051921 (2005)]," Appl. Phys. Lett 88, 146101 (2006), 3 pages.

Schmidt, V. et al., "Realization of a Silicon Nanowire Vertical Surround-Gate Field-Effect Transistor," Small, vol. 2, Issue 1, Jan. 2006, pp. 85-88.

Shen, N. et al., "Vertical GAA Silicon Nanowire Transistor with Impact of Temperature on Device Parameters," World Academy of Science, Engineering and Technology, Issue 48, Dec. 2010, pp. 976-979.

Sun, Y. et al., "Junctionless Vertical-Si-Nanowire-Channel-Based SONOS Memory With 2-Bit Storage per Cell," IEEE Electron Device Letters, vol. 32, Issue 6, Jun. 2011, pp. 725-727.

Thelander, C. et al., "Nanowire-based one-dimensional electronics," Materials Today, vol. 9, Issue 10, Oct. 2006, pp. 28-35.

Tomioka, K. et al., "A III-V nanowire channel on silicon for high-performance vertical transistors," Nature, vol. 488, Aug. 9, 2012, 14 pages.

Vandooren, A., et al., "Impact of process and geometrical parameters on the electrical characteristics of vertical nanwire silicon n-TFETs," Solid-State Electronics 72 (2012) pp. 82-87.

Wikipedia, "Strain engineering," http://en.wikipedia.org/wiki/Strain_engineering, downloaded Jul. 5, 2013, 2 pages.

Windbacher, T., "2.2.2 Local Strain," http://www.iue.tuwien.ac.at/phd/windbacher/node19.html, downloaded Jul. 5, 2013, 4 pages.

Yin, H., "Strain Relaxation of SiGe on Compliant BPSG and Its Applications," Dissertaion Presented to the Faculty of Princeton University in Candidacy for the Degree of Doctor of Philosophy, Nov. 2004, 6 pages.

Yin, H. et al., "Strain relaxation of SiGe islands on compliant oxide," Journal of Applied Physics, vol. 91, No. 12, Jun. 15, 2002, pp. 9716-9722.

Cea S.M et al., "Process Modeling for Advanced Device Technologies," J. Comput. Electron, vol. 13, Issue 1, pp. 18-32, Aug. 6, 2013.

Pham-Nguyen, et al., "Mobility enhancement by CESL strain in short-channel ultrathin SOI MOSFETs," Solid-State Electronics 54, www.elesevier.com/locate/sse, pp. 123-130, Dec. 2009.

Zhu, Yong et al., "Mechanical Properties of Vapor-Liquid-Solid Synthesized Silicon Nanowires," Nano Letters, vol. 9, No. 11, pp. 3934-3939, Jul. 2009.

(56) References Cited

OTHER PUBLICATIONS

Antcliffe, G.A., et al., "Band Structure of Doped Bismuth Using the Shubnikov-de Haas Effect," Physics Review, vol. 160, No. 3, Aug. 15, 1967, pp. 531-537.
Baek, C.-K., et al., "Characteristics of Gate-all-Around Silicon Nanowire Field Effect Transistors with Asymmetric Channel Width and Source/Drain Doping Concentration," Journal of Applied Physics 112, Aug. 13, 2012, pp. 034513-1-034513-5.
Bindal, A., et al. "Exploratory Study on Power-Efficient Silicon Nano-Wire Dynamic NMOSFET/PMESFET Logic" IET Sci. Meas. Technol. 2007, vol. 1, No. 2, 2007, pp. 121-130.
Bindal, A., et al. "The Design of DualWork Function CMOS Transistors and Circuits Using Silicon Nanowire Technology" IEEE Transactions on Nanotechnology, May 2007, vol. 6, No. 3, pp. 291-302.
Dresselhaus, M.S., et al., "Carbon Nanotubes and Bismuth Nanowires," Chapter 3, Nanoengineering of Structural, Functional and Smart Materials, M.J. Schulz, A.D. Kelkar and M.J. Sundaresan Eds, CRC Press, Taylor and Francis Group (2005), 41 pages.
Gundapaneni, et al., "Enhanced Electrostatic Integrity of Short-Channel Junctionless Transistor With High-K Spacers," IEEE Electron Device Letters, vol. 32, No. 10, Oct. 2011, pp. 1325-1327.
Hamedi-Hagh, S., et al. "Design of Next Generation Amplifiers Using Nanowire FETs," Journal of Electrical Engineering & Technology 2008, vol. 3, No. 4, pp. 566-570.
Hamedi-Hagh, S., et al., "Spice Modeling of Silicon Nanowire Field-Effect Transistors for High-Speed Analog Integrated Circuits," IEEE Transactions on Nanotechnology vol. 7, No. 6, Nov. 2008, pp. 766-775.
Jin, S., et al., "A three-dimensional simulation of quantum transport in silicon nanowire transistor in the presence of electron-phonon interactions," Journal of Applied Physics 99, 2006, pp. 123719-1-123719-10.
Lee, S., "Direct observation of the semimetal-to-semiconductor transition of individual single-crystal bismuth nanowires grown by on-film formation of nanowires,"IOP Publishing, Nanotechnology 21 (2010) 405701, pp. 1-6.
Lee, et al., "Short-Channel Junctionless Nanowire Transistors," 2010, http://www.sinano.eu/data/document/latenews.pdf, 2 pages.
Lee, et al., "Performance estimation of junctionless multigate transistors," Solid-State Electronics, vol. 54, Issue 2, Feb. 2010, pp. 97-103.
Li, L., et al., "A route to fabricate single crystalline bismuth nanowire arrays with different diameters," Chemical Physics Letters 378 (2003), pp. 244-249.
Li, L., et al., "Synthetic control of large-area, ordered bismuth nanowire arrays," Science Direct, Materials Letters 59 (2005), pp. 1223-1226.
Li, C., et al., "Bismuth nano-droplets for group-V based molecular-beam droplet epitaxy," AIP Applied Physics Letters, Applied Physics Letters 99, (2011) pp. 243113-1-243113-3.
Limmer, S., "Recrystallized Arrays of Bismuth Nanowires with Trigonal Orientation," Nano Letters, 2014, vol. 14, pp. 1927-1931.
Lin, Y-M., et al, "Transport properties of Bi nanowire arrays," Applied Physics Letters, vol. 76, No. 26, Jun. 26, 2000, pp. 3944-3946.
Partin, D.L., et al., "Growth and characterization of epitaxial bismuth films," Physical Review B, vol. 38, No. 6, Aug. 15, 1988, pp. 3818-3825.
Peng, Y., et al., "Bismuth quantum-wires arrays fabricated by electrodeposition in nanoporous anodic aluminum oxide and its structural properties," Materials Science and Engineering B77 (2000), pp. 246-249.
Sakui, K., et al., "A new vertical MOSFET Vertical Logic Circuit (VLC) MOSFET suppressing asymmetric characteristics and realizing an ultra compact and robust logic circuit," 2009 Semiconductor Device Research Symposium (ISDRS), Dec. 9-11, 2009, 2 pages.
Sato, S., et al., "Electrical characteristics of asymmetrical silicon nanowire field-effect transistors," Applied Physics Letters 99, Dec. 2, 2011, pp. 223518-1-223518-3.
Shim, W., et al., "Shubnikov-de Haas oscillations in an individual single-crystalline bismuth nanowire grown by on-film formation of nanowires," Applied Physics Letters 95, (2009), pp. 232107-1-232107-3.
Shim, W., et al., "On-Film Formation of Bi Nanowires with Extraordinary Electron Mobility," Nano Lett., 2009, 9 (1), pp. 18-22.
Sigma-Aldrich, "Bismuth", http://www.sigmaaldrich.com/materials-science/material-science-products.html?TablePage=19927132, 1 page.
Sleight, J.W., et al. "Gate-All-Around Silicon Nanowire MOSFETs and Circuits," Device Research Conference (DRC), Jun. 21-23, 2010, pp. 269-272.
Sun, Y., et al. "Demonstration of Memory String with Stacked Junction-Less SONOS Realized on Vertical Silicon Nanowire," 2011 IEEE International Electron Devices Meeting (IEDM, Dec. 5-7, 2011, pp. 9.7.1-9.7.4.
Sun, Y. et al. "Junction-Less Stackable SONOS Memory Realized on Vertical-Si-Nanowire for 3-D Application," 3rd IEEE International Memory Workshop (IMW), May 22-25, 2011, pp. 1-4.
Tsai, R-W., et al., "Voltammetric study and electrodeposition of tellurium, lead, and lead telluride in room-temperature ionic liquid 1-ethyl-3-methylimidazolium tetrafluoroborate," Electrochimica Acta 137 (2014) pp. 49-56.
van Hulst, J.A., et al., "Epitaxial growth of bismuth films and bismuth-antimony heterostructures," Physical Review B, vol. 52, No. 8, Aug. 15, 1995-II, pp. 5953-5964.
Venugopalan, S., et al., "Modeling Intrinsic and Extrinsic Asymmetry of 3D Cylindrical Gate/ Gate-All-Around FETs for Circuit Simulations," 11th Annual Non-Volatile Memory Technology Symposium (NVMTS), Nov. 7-9, 2011, 4 pages.
Zhou, L., et al., "Nucleation and Growth of Bismuth Electrodeposition from Alkaline Electrolyte," Nucleation and Growth of Bismuth Electrodeposition, Bull. Korean Chem. Soc. 2012, vol. 33, No. 5, pp. 1541-1546.

* cited by examiner

METHOD FOR INDUCING STRAIN IN VERTICAL SEMICONDUCTOR COLUMNS

BACKGROUND

Vertical Transistors are being researched recently. In a vertical transistor, a vertical column, which may be a vertical nano-wire formed of a semiconductor material, is formed over a substrate, which may be a bulk semiconductor wafer or a Semiconductor-On-Insulator (SOI) wafer. A gate dielectric and a gate electrode are formed to encircle the nano-wire, with the encircled portion of the nano-wire forming the channel of the respective vertical transistor. A source and a drain are formed, with one underlying the channel, and the other overlying the channel. The vertical transistor has a gate-all-around structure since the gate may fully encircle the channel. With the all-around gate structure, the drive current of the vertical transistor is high and short-channel effects are minimized.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Vertical Metal-Oxide-Semiconductor (MOS) transistors and the methods of forming the same are provided in accordance with various exemplary embodiments. The intermediate stages of forming the vertical MOS transistors are illustrated in accordance with exemplary embodiments. The variations and the operation of the vertical MOS transistors are discussed. Throughout the various views and illustrative embodiments, like reference numbers are used to designate like elements.

Figure 1A:
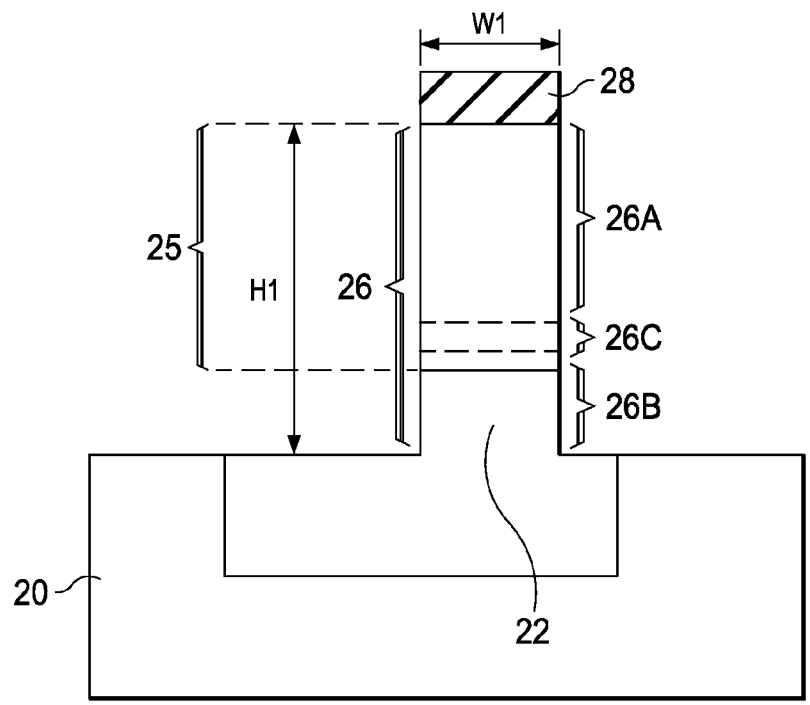
FIGS. 1A through 1Q are cross-sectional views of intermediate stages in the manufacturing of a vertical NMOS transistor in accordance with some exemplary embodiments.

FIG. 1A illustrates the initial steps for forming a vertical MOS transistor. Substrate 20, which is a portion of a semiconductor wafer, is provided. Substrate 20 may be a semiconductor substrate such as a silicon substrate, although other materials such as silicon germanium, silicon carbon, and the like, may be used. Substrate 20 may also be a bulk semiconductor substrate or a silicon-on-insulator substrate. In some embodiments, substrate 20 is lightly-doped with a p-type impurity. Region 22 is formed in substrate 20, for example, through an implantation step. Region 22 may be one of the source region or the drain region of the resulting vertical MOS transistor, and hence is referred to as a first source/drain region hereinafter. Throughout the description, when a region is referred to as a "source/drain" region, the region may be a source region or a drain region. The first source/drain region 22 may be heavily doped with an n-type impurity such as phosphorous, arsenic, and the like, for example, to an impurity concentration between about $1 \times 10^{19}/cm^3$ and about $1 \times 10^{21}/cm^3$.

Nano-wire 26 is formed over substrate 20, wherein the first source/drain region 22 may extend into nano-wire 26. In some embodiments, nano-wire 26 has a horizontal dimension W1 between about 10 nm and about 40 nm. It is appreciated, however, that the values recited throughout the description are merely examples, and may be changed to different values. The height H1 of nano-wire 26 may be between about 10 nm and about 45 nm. Hard mask 28 is formed over nano-wire 26, and may comprise silicon nitride, although other materials such as silicon oxide or oxynitride may be used. The formation of nano-wire 26 may include, after implanting a surface portion of substrate 20 to form source/drain region 22, performing an epitaxy to grow a semiconductor layer (such as silicon, silicon germanium, III-V semiconductor, or the like) over substrate 20, forming a hard mask layer over the epitaxy layer, and then patterning the hard mask layer and the epitaxy layer to form hard mask 28 and nano-wire 26, respectively. The epitaxy layer may have a homogeneous structure having a uniform material such as silicon or silicon germanium. Alternatively, the epitaxy layer may have a heterogeneous structure including more than one layer. For example, portion 26C of nano-wire 26 may be formed of germanium or silicon germanium, and portions 26A and 26B may be formed of silicon or silicon germanium. In the embodiments in which portions 26A, 26B, and 26C all include silicon germanium, the germanium percentage in portion 26C is greater than the germanium percentage in portions 26A and 26B. In the patterning for forming nano-wire 26, a slightly over-etch may be performed, so that a top portion of substrate 20 forms a bottom portion of nano-wire 26. The respective nano-wire 26 thus includes epitaxy portion 25 over first source/drain region 22. Epitaxy portion 25 may be a p-type region, an intrinsic region, or an n-type region, and may be in-situ doped during the epitaxy.

Figure 1B:
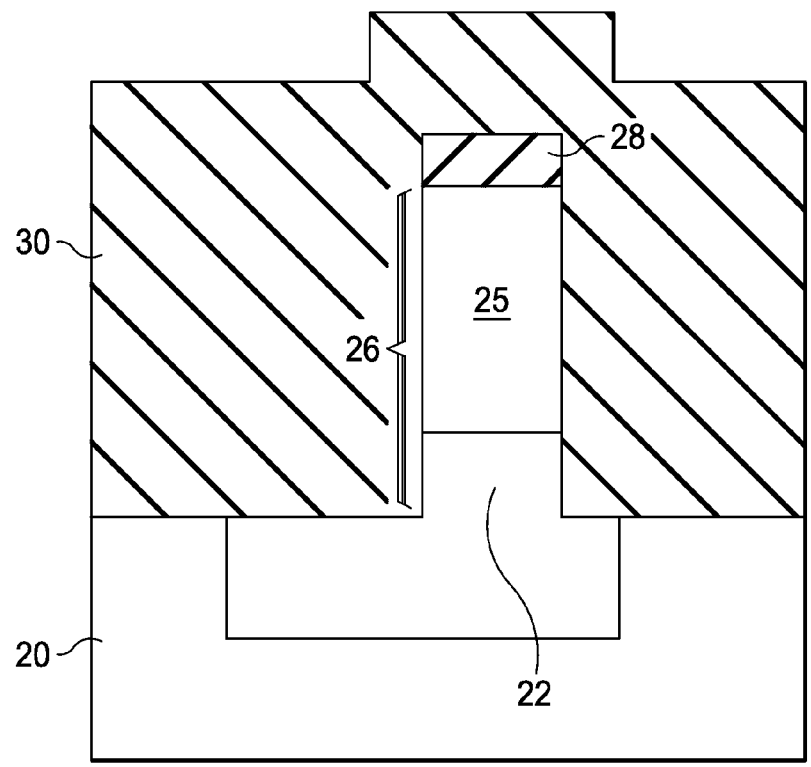
Figure 1C:
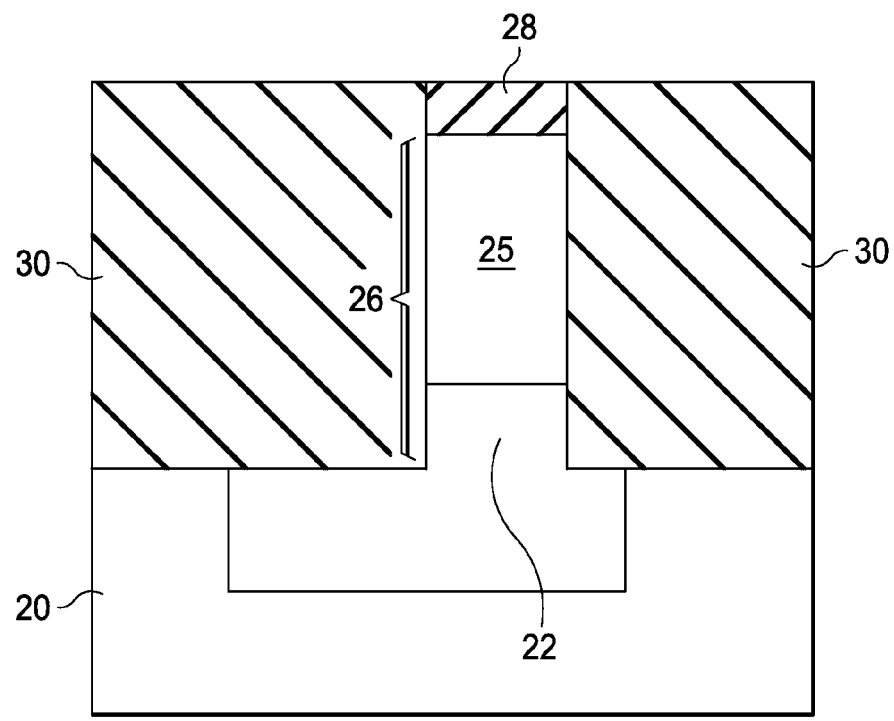
Figure 1D:
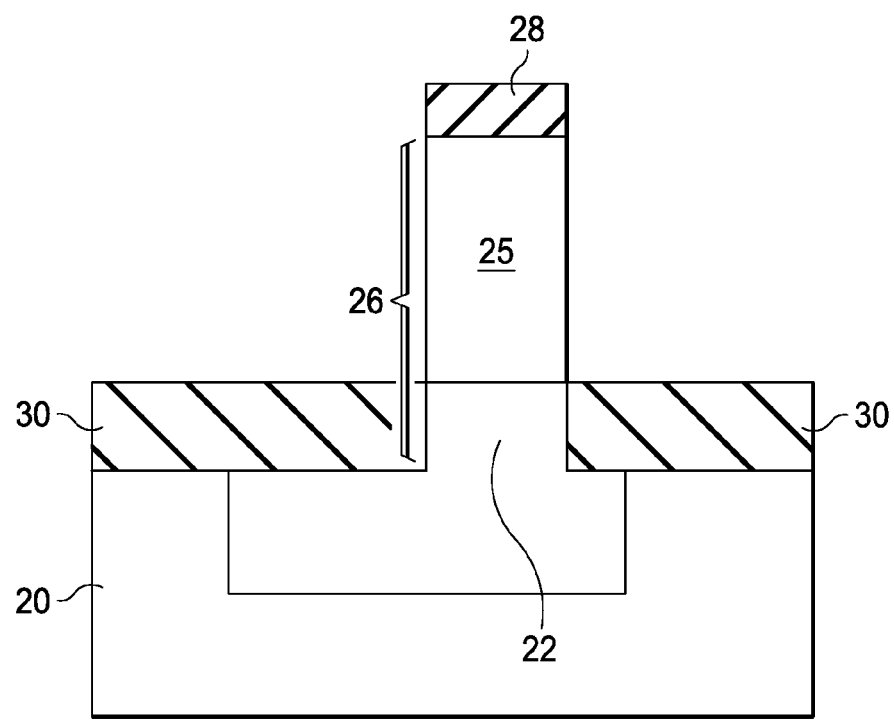

Referring to FIG. 1B, dielectric layer 30 is formed. In some embodiments, dielectric layer 30 comprises an oxide such as silicon oxide. The top surface of dielectric layer 30 is higher than hard mask 28. Next, as shown in FIG. 1C, a Chemical Mechanical Polish (CMP) is performed to level the top surface of dielectric layer 30 with the top surface of hard mask 28. In a subsequent step, as shown in FIG. 1D, an etch-back is performed on dielectric layer 30, and dielectric layer 30 is recessed. In some embodiments, the top surface of dielectric layer 30 is level with or lower than the interface between source/drain region 22 and epitaxy portion 25, although the top surface of dielectric layer 30 may be higher than or at the same height as the interface.

Figure 1E:
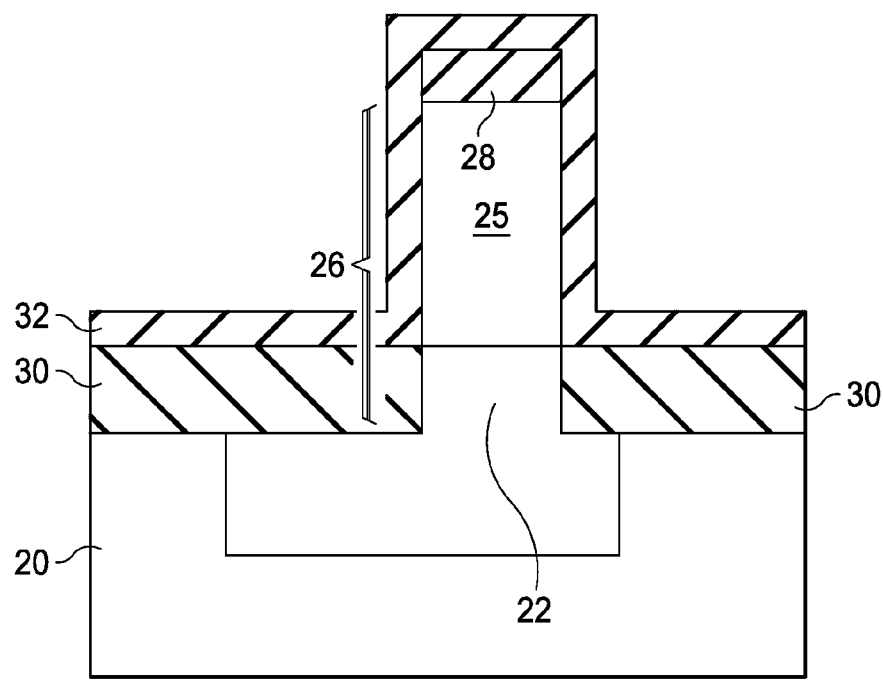
Figure 1F:
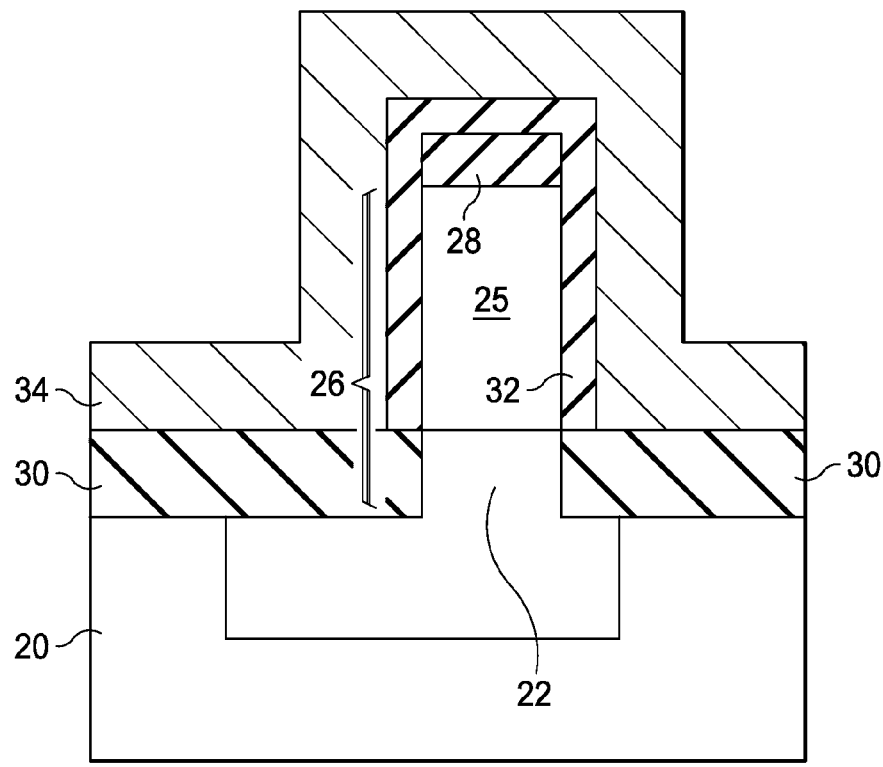

FIG. 1E illustrates the formation of gate dielectric layer 32. In some embodiments, gate dielectric layer 32 is formed in a conformal deposition process. Gate dielectric layer 32 may comprise a high-k dielectric material such as hafnium oxide, zirconium oxide, or the like. Other oxides and/or nitrides of Hf, Al, La, Lu, Zr, Ti, Ta, Ba, Sr, and/or the like, may also be used in gate dielectric layer 32. As shown in FIG. 1F, an etch step is then performed to remove the horizontal portions of gate dielectric layer 32, while the vertical portions of gate dielectric layer 32 are left on the sidewalls of nano-wire 26. Next, gate electrode layer 34 is formed over gate dielectric layer 32, as also shown in FIG. 1F. Gate electrode layer 34 may include Al, Ti, Ta, W, Mo, Ru, Pt, Co, Ni, Pd, Nb, or alloys thereof. In other embodiments, gate electrode layer 34 also includes metallic compound such as TiN, TaC, or TaN.

Figure 1G:
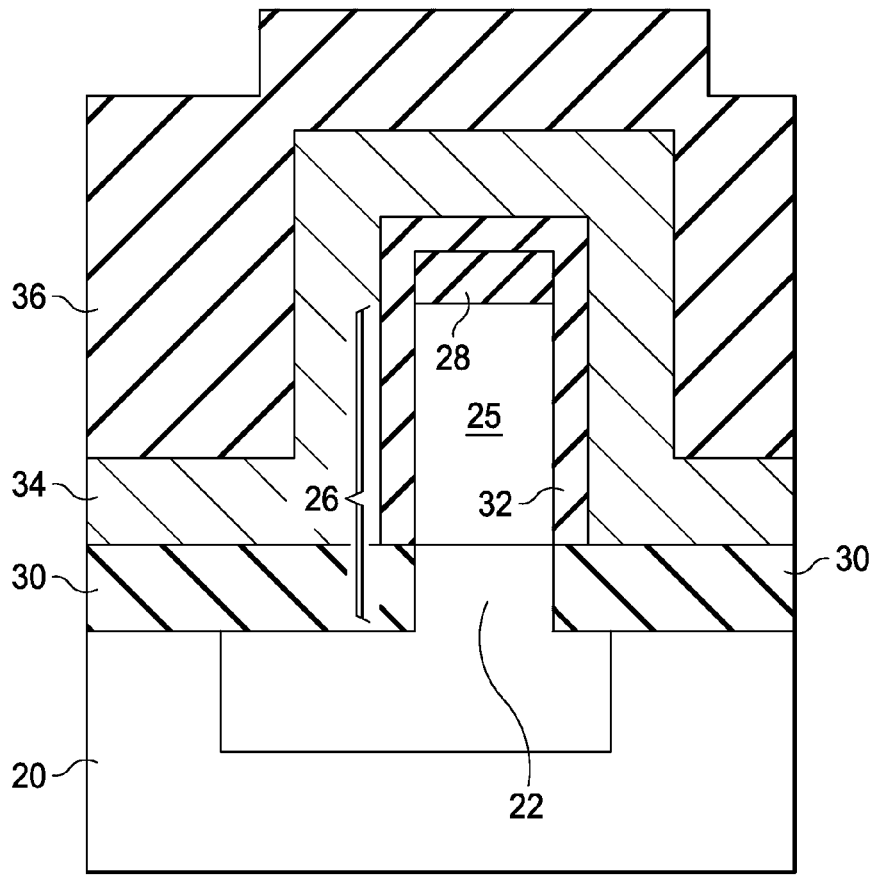
Figure 1H:
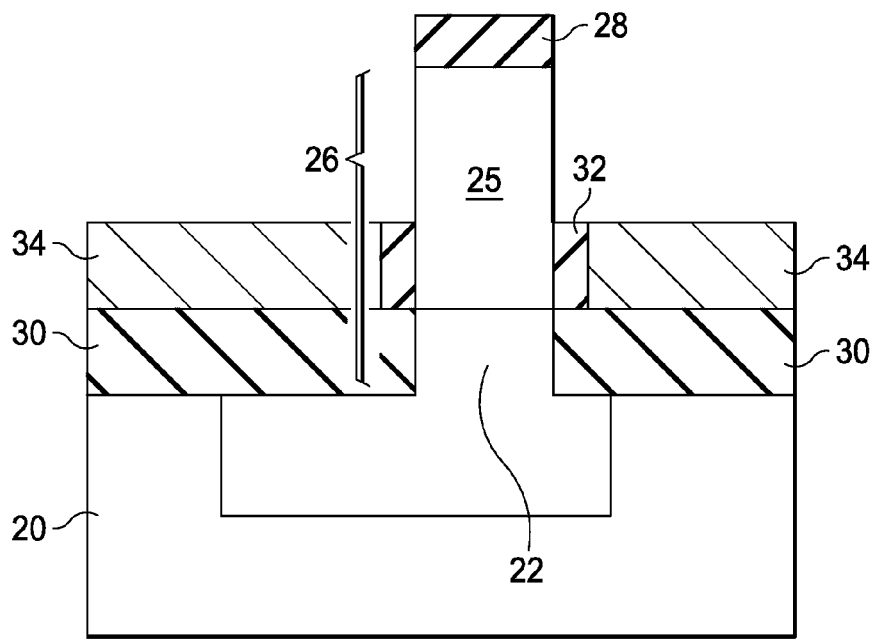

FIG. 1G illustrates the formation of sacrificial oxide 36, which is deposited to a level higher than the top surface of hard mask 28. A CMP is then performed to level the top surface of sacrificial oxide 36 with the top surface of hard mask 28. As shown in FIG. 1H, etch-back steps are then performed to remove the vertical portions of gate electrode layer 34 and the exposed portions of gate dielectric layer 32. The removed portions of gate dielectric layer 32 are over the horizontal portion of gate electrode layer 34. The remaining vertical portion of gate dielectric layer 32 is referred to as gate dielectric 32 hereinafter.

Figure 1I:
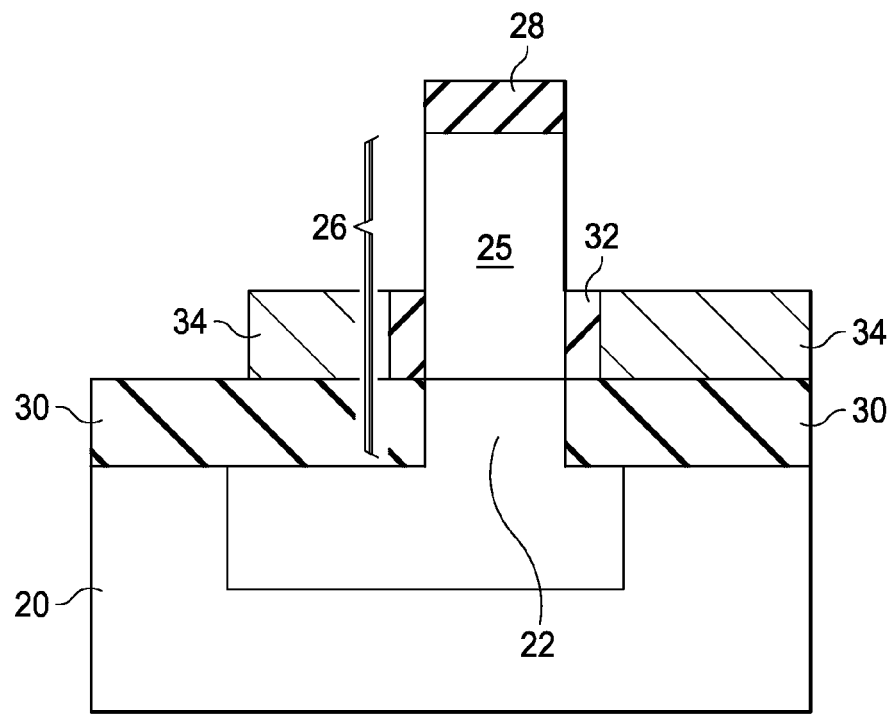

Next, referring to FIG. 1I, gate electrode 34 is further patterned. The remaining portion of gate electrode layer 34 is referred to as gate electrode 34 hereinafter. Gate dielectric 32 and gate electrode 34 form the gate stack of the resulting vertical MOS transistor. In a top view of the structure in FIG. 1I, gate dielectric 32 and gate electrode 34 encircle nano-wire 26.

Figure 1J:
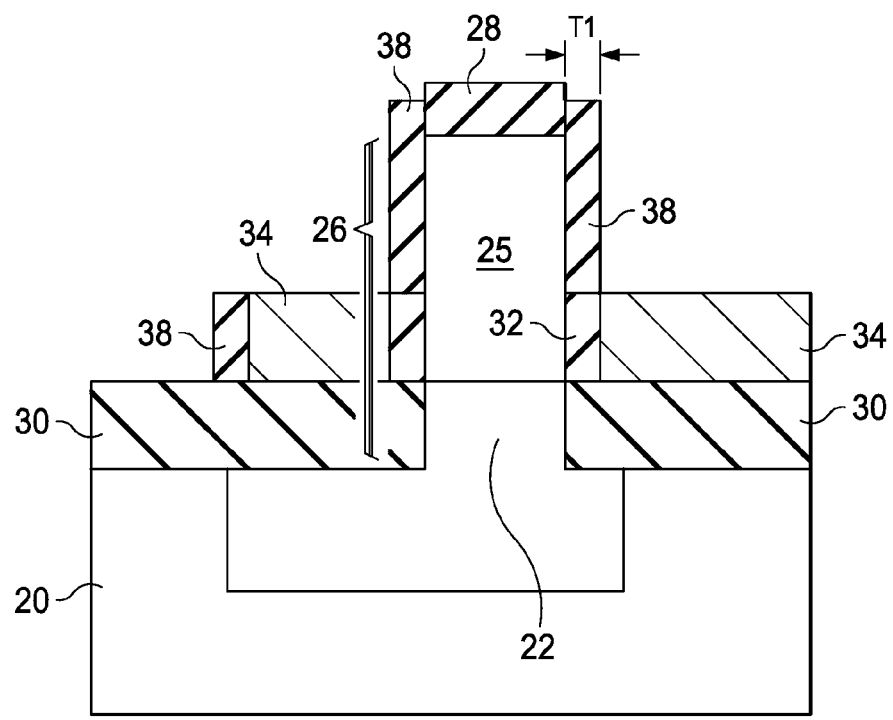

Next, as shown in FIG. 1J, low-viscosity spacer 38 is formed on the sidewalls of nano-wire 26, and over gate electrode 34. Low-viscosity spacer 38 encircles, and is in contact with, the top portion of nano-wire 26. The material of low-viscosity spacer 38 is selected, so that at temperatures (for example, between about 400° C. and about 1,000° C.) that are used in the subsequent oxidation of nano-wire 26, low-viscosity spacer 38 is at least softened to have certain viscosity, and hence stress may be generated more efficiently in nano-wire 26. In some embodiments, low-viscosity spacer 38 comprises Boron-Doped Phospho-Silicate Glass (BPSG), silicon germanium oxide, or the like, which have melting and softening temperatures lower that of silicon oxide. Alternatively stated, when heated with gradually increased temperatures, low-viscosity spacer 38 becomes soft earlier than silicon oxide. Thickness T1 of low-viscosity spacer 38 may be between about 0.5 nm and about 4 nm in accordance with exemplary embodiments.

Figure 1K:
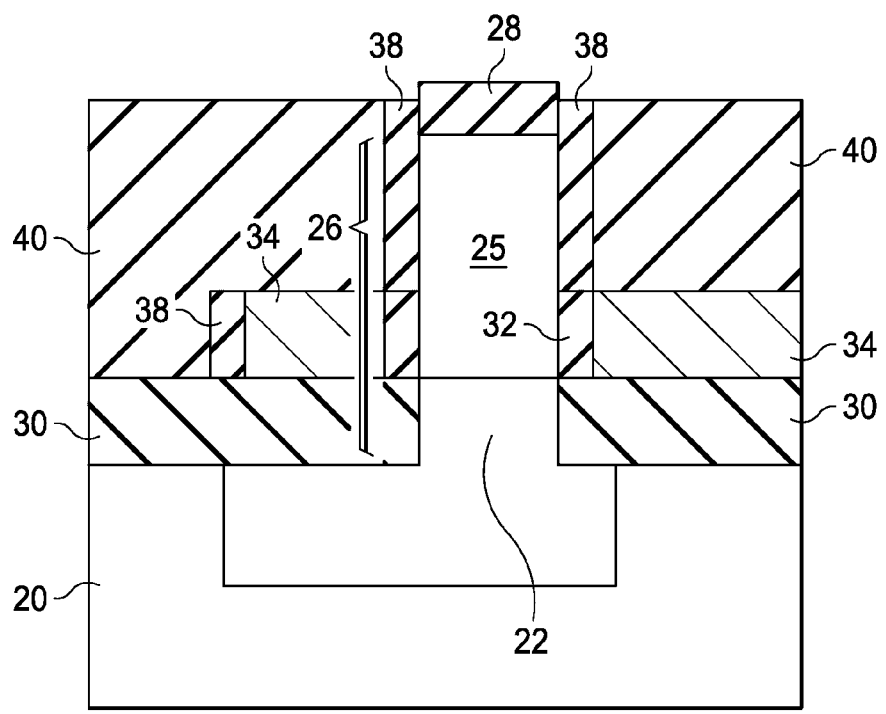
Figure 1L:
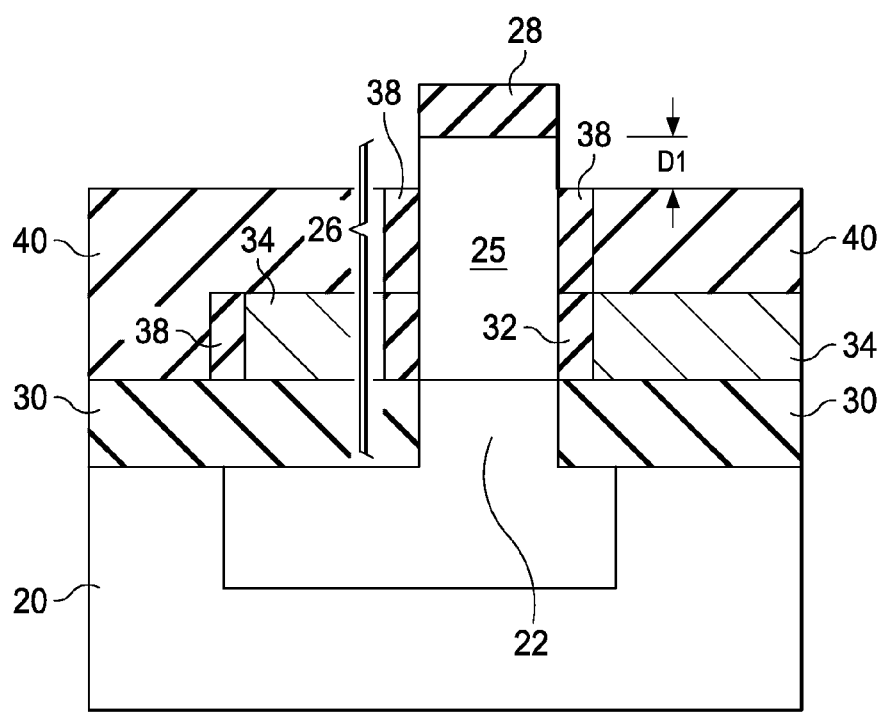

FIG. 1K illustrates the formation of dielectric layer 40 and the CMP step. In some embodiments, dielectric layer 40 comprises silicon oxide ($SiO_2$), although other dielectric materials may be used. Dielectric layer 40 and low-viscosity spacer 38 are then etch back, as shown in FIG. 1L, and hence the top surfaces of dielectric layer 40 and low-viscosity spacer 38 are recessed. Depth D1 of the resulting dielectric layer 40 and low-viscosity spacer 38 may have depth D1 greater than about 2 nm, for example. The top portion of nano-wire 26 thus protrudes over the top surface of dielectric layer 40.

Figure 1M:
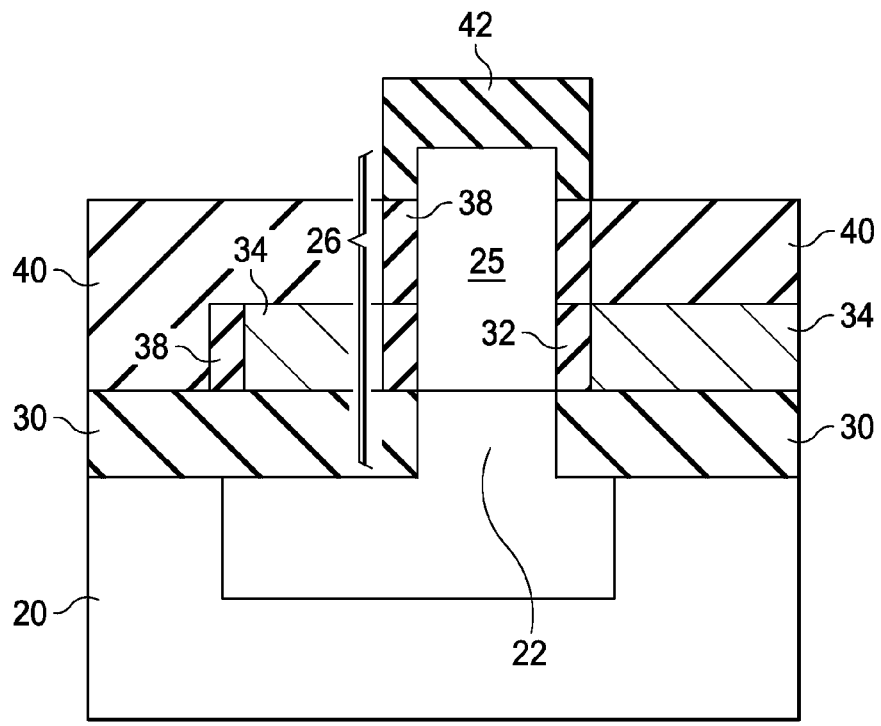

In accordance with some embodiments, hard mask 28 may be removed, and the resulting structure is shown in FIG. 1M.

Figure 1N:
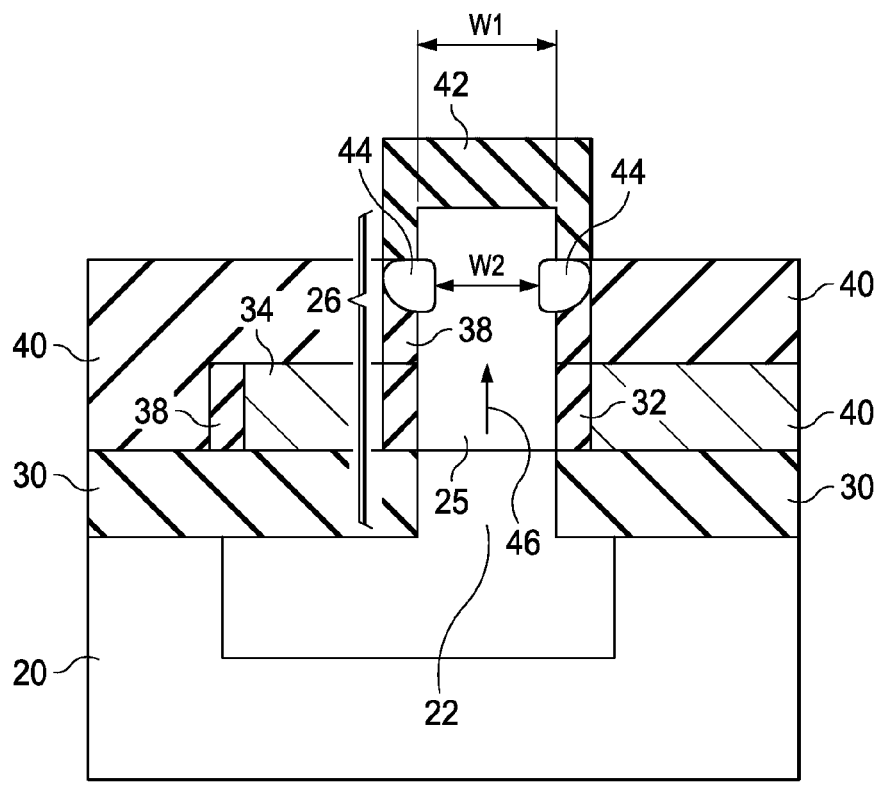

In alternative embodiments, hard mask 28 is removed in a later step, such as in a step after the step shown in FIG. 1O, and before the step shown in FIG. 1P. Non-permeable layer 42 is formed on the top surface and sidewalls of the protruding nano-wire 26. Non-permeable layer 42 is formed of a material that is not permeable by oxygen ($O_2$). The thickness of non-permeable layer 42 is also great enough to block the penetration of oxygen, and the thickness may be between about 1 nm and about 5 nm in accordance with exemplary embodiments. Non-permeable layer 42 has a shape of a cap, with a top portion, and a ring portion underlying and connected to the top portion. The ring portion encircles low-viscosity spacer 38.

The structure in FIG. 1M may then go through a local oxidation process, during which the structure in FIG. 1M is placed in an oxygen-containing ambient, and is heated. The oxygen-containing ambient may comprise oxygen ($O_2$), for example. In the local oxidation, the respective wafer may be heated to an elevated temperature between about 450° C. and about 1,000° C. The local oxidation may be performed for a period of time between about 1 minutes and about 100 minutes. In other embodiments, the oxidation is performed through a chemical oxidation at a low temperature, for example, using a chemical oxidizing agent or an oxidizing plasma. During the local oxidation, non-permeable layer 42 prevents oxygen from penetrating, and hence the portion of nano-wire 26 protected by non-permeable layer 42 is not oxidized. As a result of the local oxidation, the oxygen penetrates through the top portion of dielectric layer 40, and hence a middle portion of nano-wire 26 is oxidized to form oxide ring 44, which encircles, and extends into, nano-wire 26. The oxidized middle portion is close to the interface between non-permeable layer 42 and dielectric layer 40. Oxide ring 44 extends beyond the respective sidewalls of nano-wire 26. The resulting nano-wire 26 thus includes a first portion over oxide ring 44, a second portion underlying oxide ring 44, and a third portion encircled by oxide ring 44. The first portion and the second portion of nano-wire 26 may have a similar horizontal width W1, while the third portion has a second horizontal width W2 smaller than horizontal width W1. Oxide ring 44 may be in contact with the underlying low-viscosity layer 38 and the underlying non-permeable layer 42.

As a result of the local oxidation, the generated oxide ring 44 has a volume greater than the volume of the oxidized portion of nano-wire 26. Oxide ring 44 is hence expanded in volume over the oxidized portion of nano-wire 26, generating tensile strain 46 in nano-wire 26. During the oxidation, low-viscosity spacer 38 is at least slightly softened, and hence it is easier for nano-wire 26 to have the shape change and volume change, and hence the tensile strain 46 is easy to be generated. Low-viscosity spacer 38 thus acts as the lubricant for the generation of tensile strain 46. Tensile strain 46 may be as high as about 2G Pascal to about 8G Pascal in accordance with simulation results. The formation of low-viscosity spacer 38 can be omitted if the strained is desirable to be concentrated in the upper part (drain side) of the respective transistor.

Figure 1O:
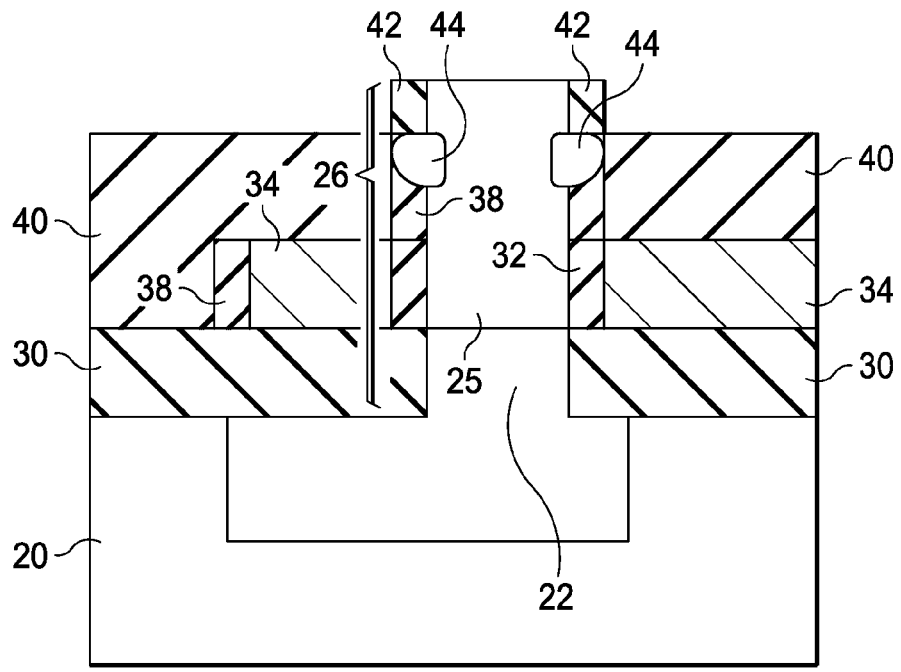
Figure 1P:
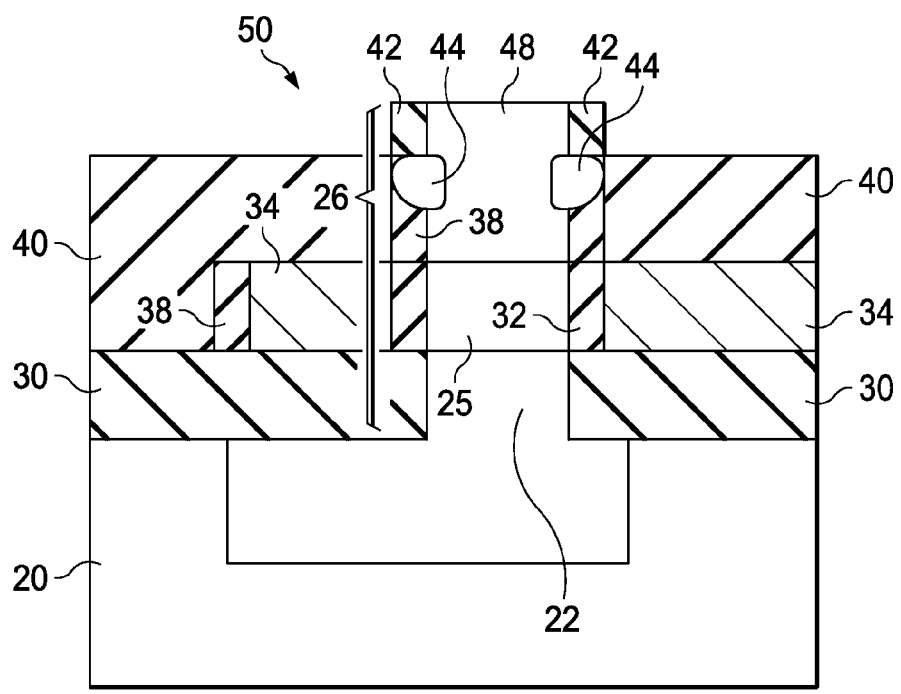

Next, referring to FIG. 1O, the top portion of non-permeable layer 42, which portion is over nano-wire 26, is removed. If hard mask 28 (FIG. 1L) has not been removed yet, it may also be removed at this stage. The sidewall portion of non-permeable layer 42 encircling the top portion of nano-wire 26 may be left un-removed. FIG. 1P illustrates the doping of the top portion of nano-wire 26 to form source/drain region 48, wherein the doping step may be achieved by implanting an n-type impurity. Source/drain region 48 may be heavily doped to an impurity concentration between about $1\times10^{19}/cm^3$ and about $1\times10^{21}/cm^3$. At least a portion of nano-wire 26 encircled by gate electrode 34 is not doped in this step, which portion forms the channel of the resulting vertical MOS transistor 50. Alternatively, the doping of the top portion of the wire can be performed before the growth of the strain-generating oxide.

Figure 1Q:
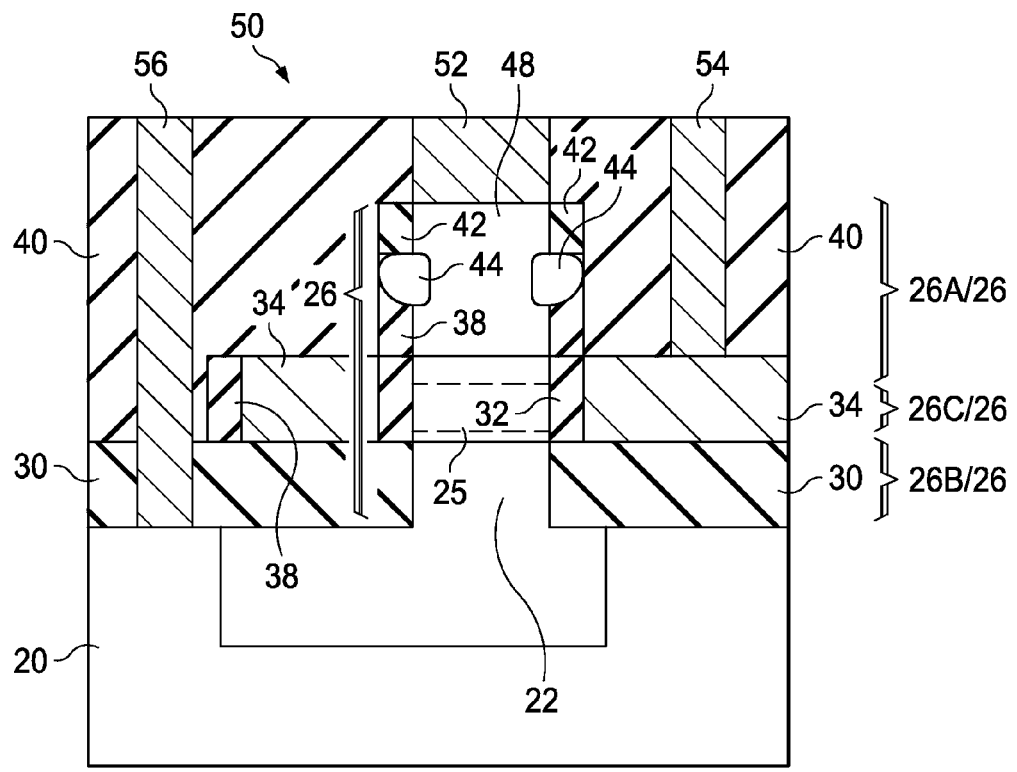

FIG. 1Q illustrates the formation of gate contact plug 54 and source/drain contact plugs 52 and 56. Gate contact plug 54 may comprise a metal comprising W, Ti, Ni, Co, or the silicides thereof including $TiSi_2$, $NiSi_2$, $WSi_2$, $CoSi_2$, or the like. Gate contact plug 54 is electrically coupled to gate electrode 34. Source/drain contact plugs 52 and 56 are electrically coupled to source/drain regions 48 and 22, respectively. MOS transistor 50 is hence formed. MOS transistor 50 is an NMOS transistor, and hence tensile strain 46 (FIG. 1N) helps improve its drive current Ion.

FIGS. 2A through 2G illustrate cross-sectional views of intermediate stages in the formation of an NMOS transistor in accordance with alternative embodiments. Unless specified otherwise, the materials and the formation methods of the components in these embodiments are essentially the same as the like components, which are denoted by like reference numerals in the embodiments shown in FIGS. 1A through 1Q. The details regarding the formation process and the materials of the components shown in FIGS. 2A through 2G may thus be found in the discussion of the embodiment shown in FIGS. 1A through 1Q.

The initial steps of these embodiments are essentially the same as shown in FIGS. 1A through 1I. Next, referring to FIG. 2A, low-viscosity spacer 38 is formed on the sidewalls of nano-wire 26, and encircles nano-wire 26. Low-viscosity spacer 38 may comprise BPSG or silicon germanium oxide, for example. Non-permeable layer 42 is also formed, which may be formed of silicon nitride, for example. In these embodiments, non-permeable layer 42 forms a ring that encircles low-viscosity spacer 38. Non-permeable layer 42 is hence referred to as non-permeable ring 42 hereinafter.

Figure 2A:
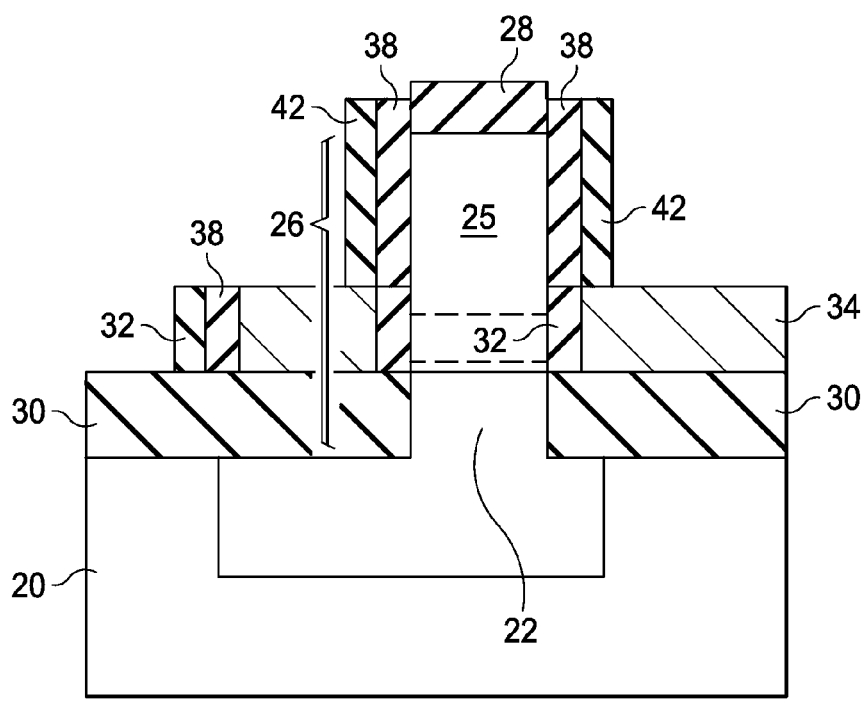
FIGS. 2A through 2G are cross-sectional views of intermediate stages in the manufacturing of a vertical NMOS transistor in accordance with alternative exemplary embodiments.
Figure 2B:
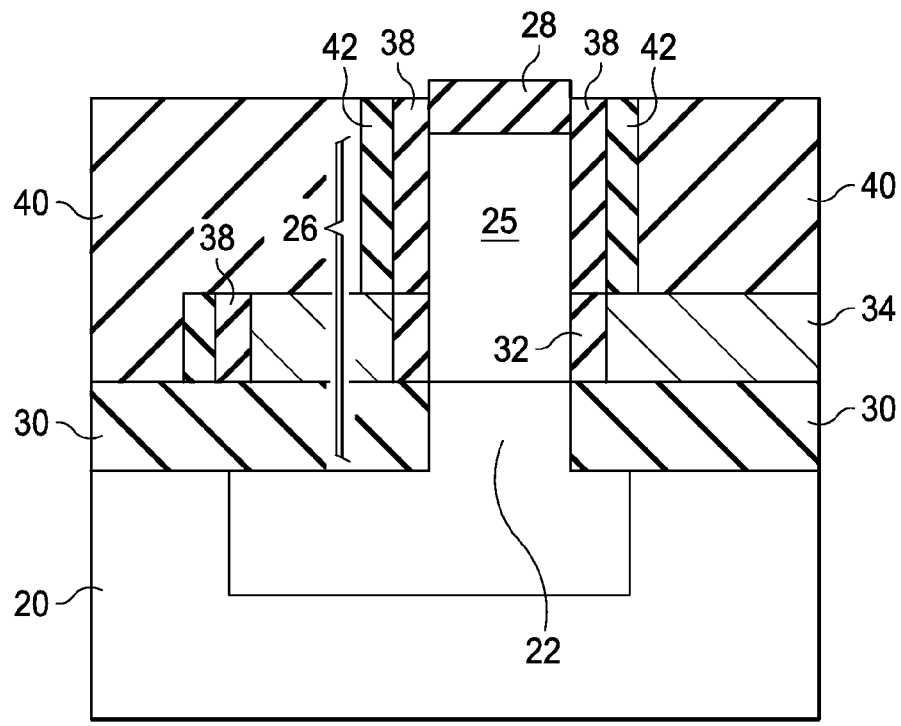
Figure 2C:
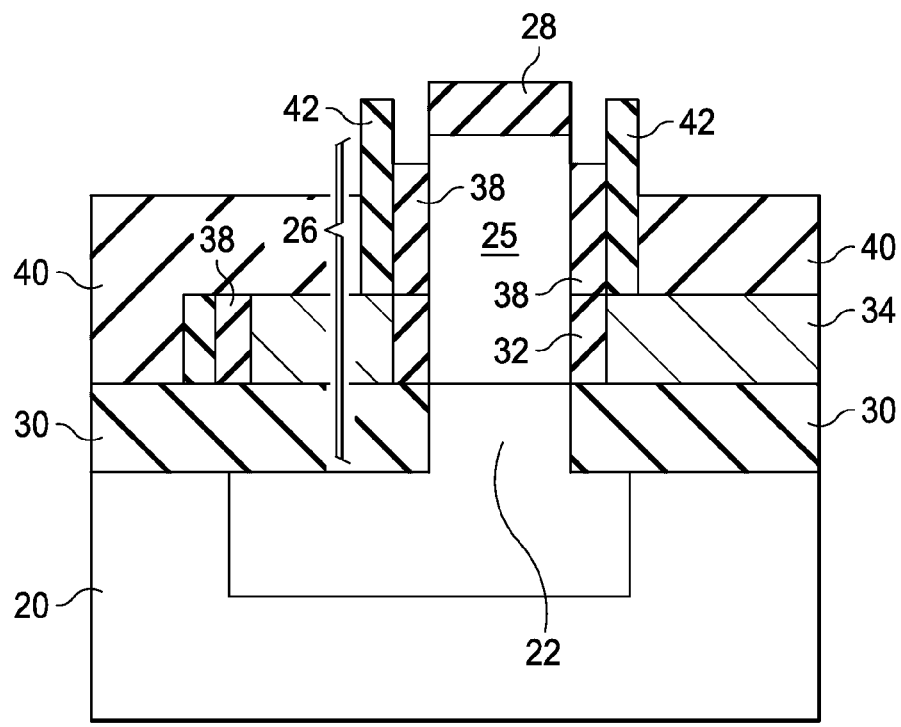
Figure 2D:
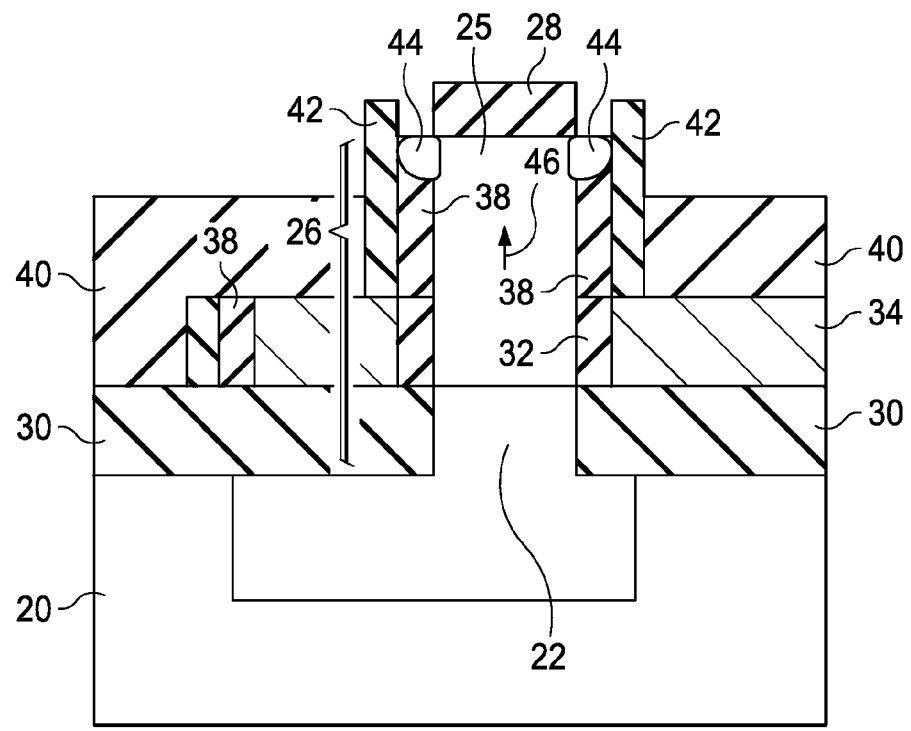

Referring to FIG. 2B, dielectric layer 40 is formed, followed by a CMP step, wherein hard mask 28 and non-permeable layer 42 may act as the CMP stop layer. Dielectric layer 40 is then recessed, as shown in FIG. 2C, followed by a local oxidation step to generate oxide regions 44, as shown in FIG. 2D. The local oxidation is performed by oxidizing a top portion (a top ring) of nano-wire 26. The top end of oxide ring 44 is substantially level with the top surface of nano-wire 26. Oxide ring 44 also extends beyond the respective sidewalls of nano-wire 26. Again, due to the expansion in the volume of the oxidized portion of nano-wire 26, tensile stress may be generated in nano-wire 26, wherein low-viscosity spacer 38 makes the generation of the tensile stress easier. The formation of low-viscosity spacer 38 can be omitted if the strained is desirable to be concentrated in the upper part (drain side) of the respective transistor.

Figure 2E:
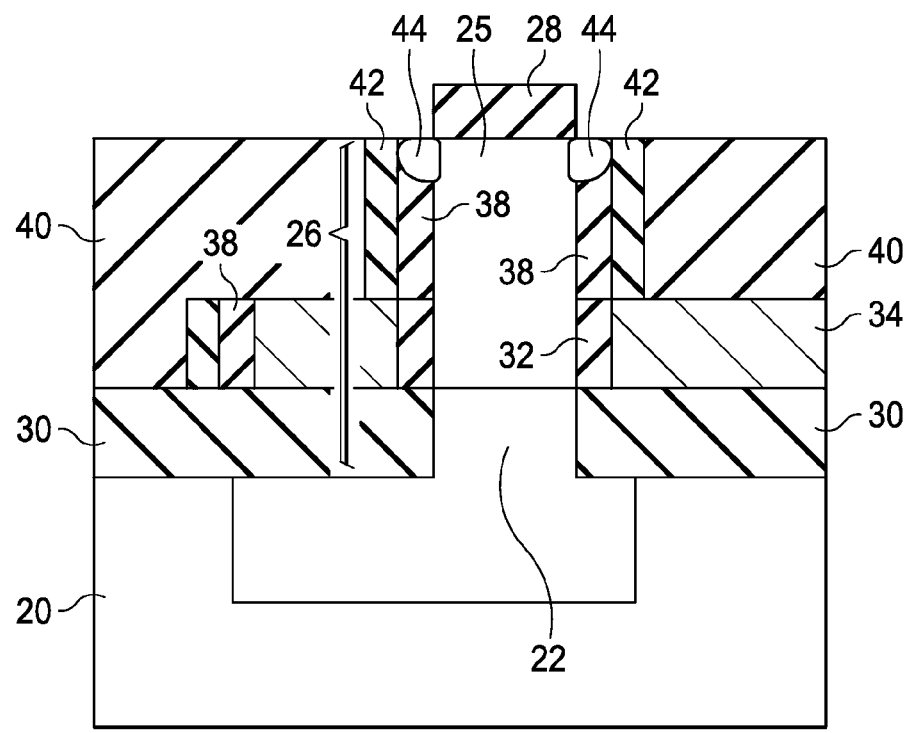
Figure 2F:
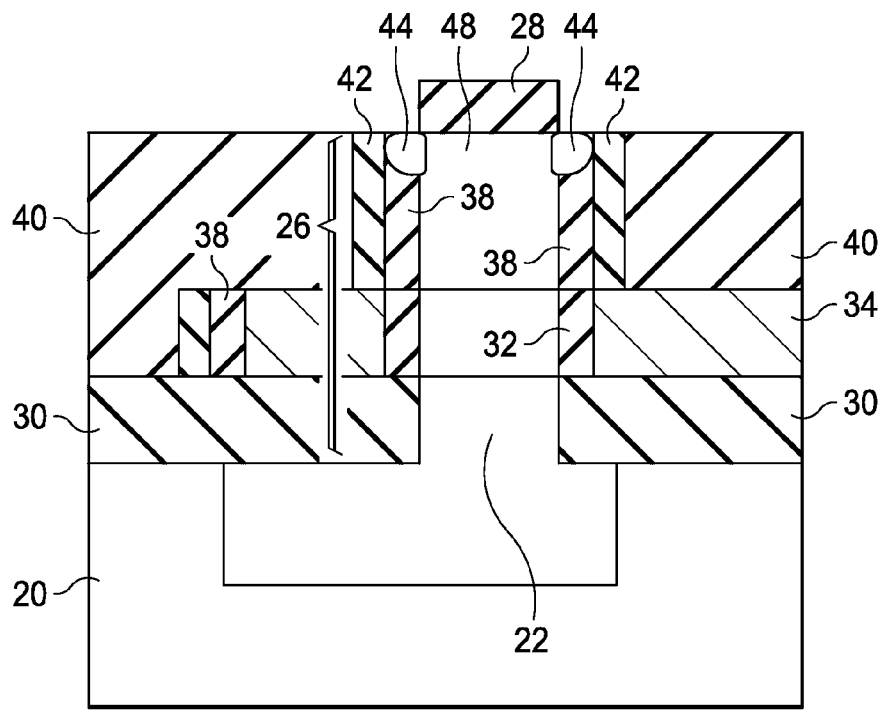
Figure 2G:
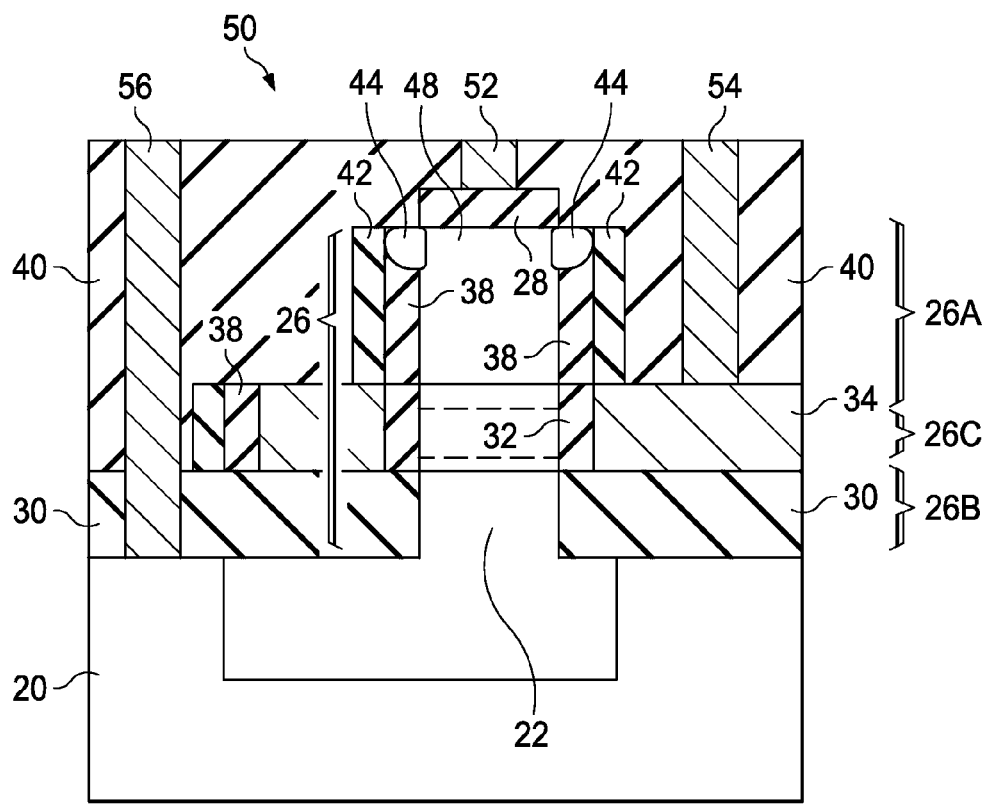

FIG. 2E illustrates the replenishment of dielectric layer 40. Next, as shown in FIG. 2F, an implantation is performed to form source/drain region 48. Source/drain region 48 may be heavily doped to an n-type impurity concentration between about $1\times10^{19}/cm^3$ and about $1\times10^{21}/cm^3$. Contact plugs 52, 54, and 56 are then formed to finish the formation of vertical MOS transistor 50, as shown in FIG. 2G. Alternatively, the doping of the top portion of the transistor can be achieved prior to the growth of the strain-generating oxide.

FIGS. 3A through 3G illustrate cross-sectional views of intermediate stages in the formation of a vertical PMOS transistor in accordance with alternative embodiments. Unless specified otherwise, the materials and formation methods of the components in these embodiments are similar to the like components, which are denoted by like reference numerals in the embodiments shown in FIGS. 1A through 2G. The details regarding the formation process and the materials of the components shown in FIGS. 3A through 3G may thus be found in the discussion of the embodiment shown in FIGS. 1A through 2G.

Figure 3A:
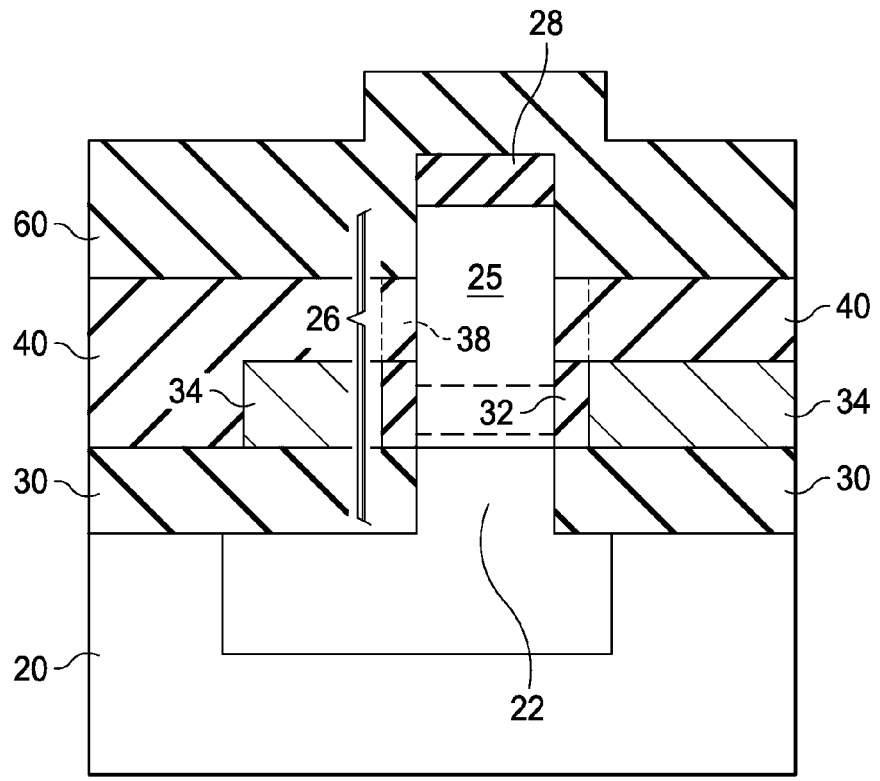
FIGS. 3A through 3G are cross-sectional views of intermediate stages in the manufacturing of a vertical PMOS transistor in accordance with some exemplary embodiments.
Figure 3B:
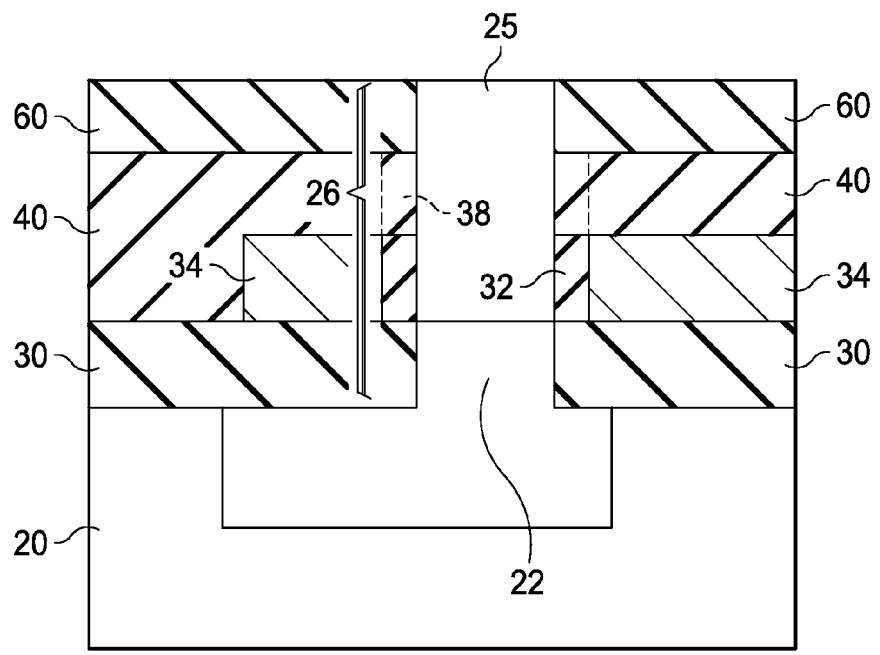

The initial steps of these embodiments are similar to shown in FIGS. 1A through 1I. Source/drain region 22 is of p-type in these embodiments. Next, referring to FIG. 3A, dielectric layer 40 is formed, followed by an etch back of dielectric layer 40. After the etch back, A top portion of nano-wire 26 is above the top surface of dielectric layer 40. Hard mask layer 60 is then formed over hard mask 28 and dielectric layer 40. Hard mask layer 60 may comprise silicon nitride in accordance with some embodiments, although different materials that are difficult for oxygen to penetrate may be used. Next, as shown in FIG. 3B, hard mask 28 and the portion of hard mask layer 60 overlapping hard mask 28 are removed, for example, in a CMP step. The top surface of nano-wire 26 is exposed through hard mask 60. Similar to the embodiments shown in FIGS. 1A through 2G, for vertical PMOS transistors, low-viscosity spacer 38 may be formed to encircle nano-wire 26, as schematically illustrated in FIG. 3B.

Figure 3C:
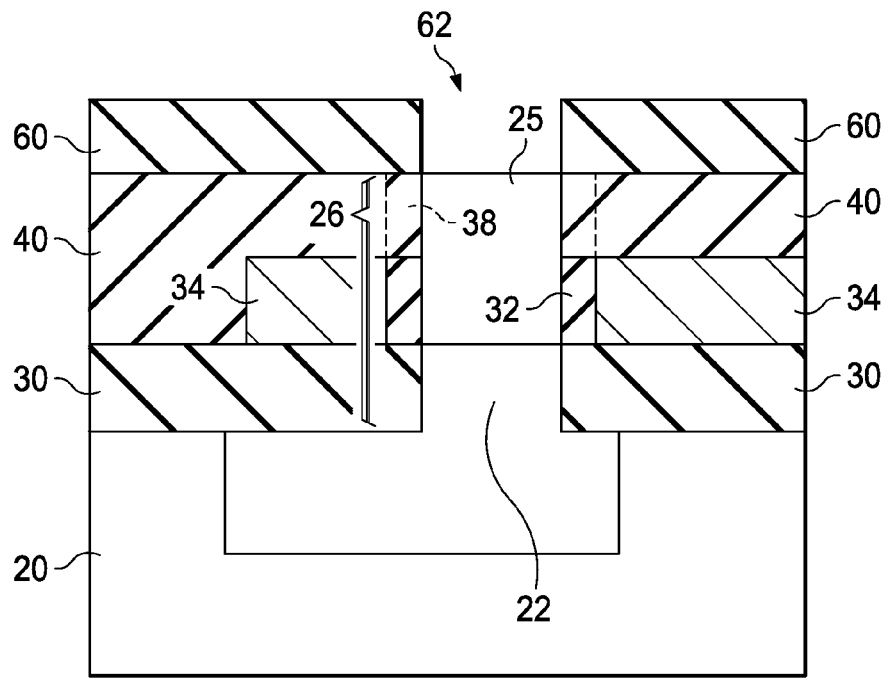
Figure 3D:
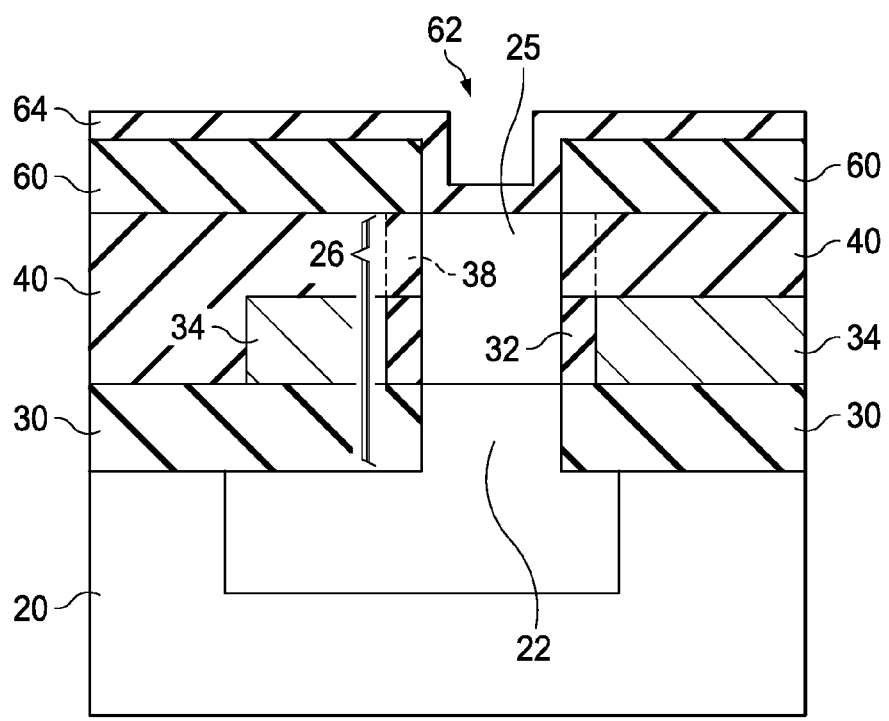

FIG. 3C illustrates the recess of nano-wire 26, which includes etching nano-wire 26. Opening 62 is thus formed in hard mask 60. The top surface of the remaining nano-wire 26 may be substantially level with or lower than the bottom surface of hard mask 60. Hard mask layer 64 is then formed as a substantially conformal layer over hard mask 60 and dielectric layer 40, and extends into opening 62. Hard mask layer 64 has a thickness smaller than one half, and may be smaller than about 25 percent, the thickness of hard mask 60. Hard mask layer 64 may comprise silicon nitride in accordance with some embodiments, although other materials that are difficult for oxygen to penetrate may also be used.

Figure 3E:
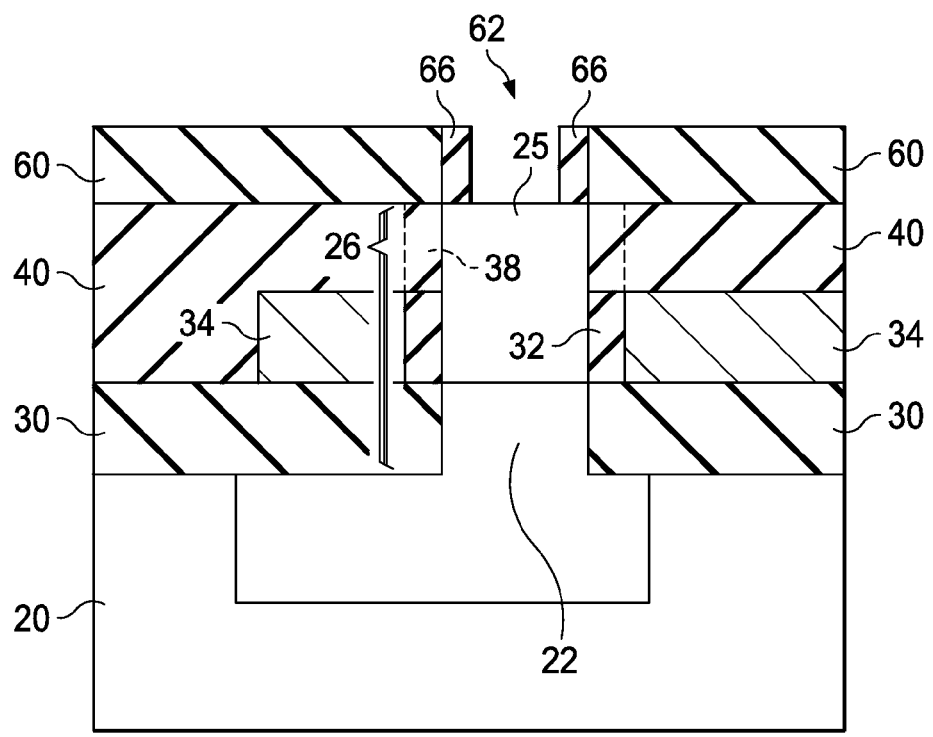

FIG. 3E illustrates the removal of the horizontal portions of hard mask layer 64 (FIG. 3D), which may be achieved, for example, through an anisotropic etch step. The remaining portion of hard mask layer 64 in opening 62 forms spacer 66, which is a ring on the sidewall of hard mask 60. Although spacer ring 66 and hard mask 60 may be formed of the same material or different materials. Since they are formed in different processes, there may be a distinguishable interface between spacer ring 66 and hard mask 60, regardless of whether they are formed of the same material or not. A portion of nano-wire 26 is exposed through the center region of spacer ring 66.

Figure 3F:
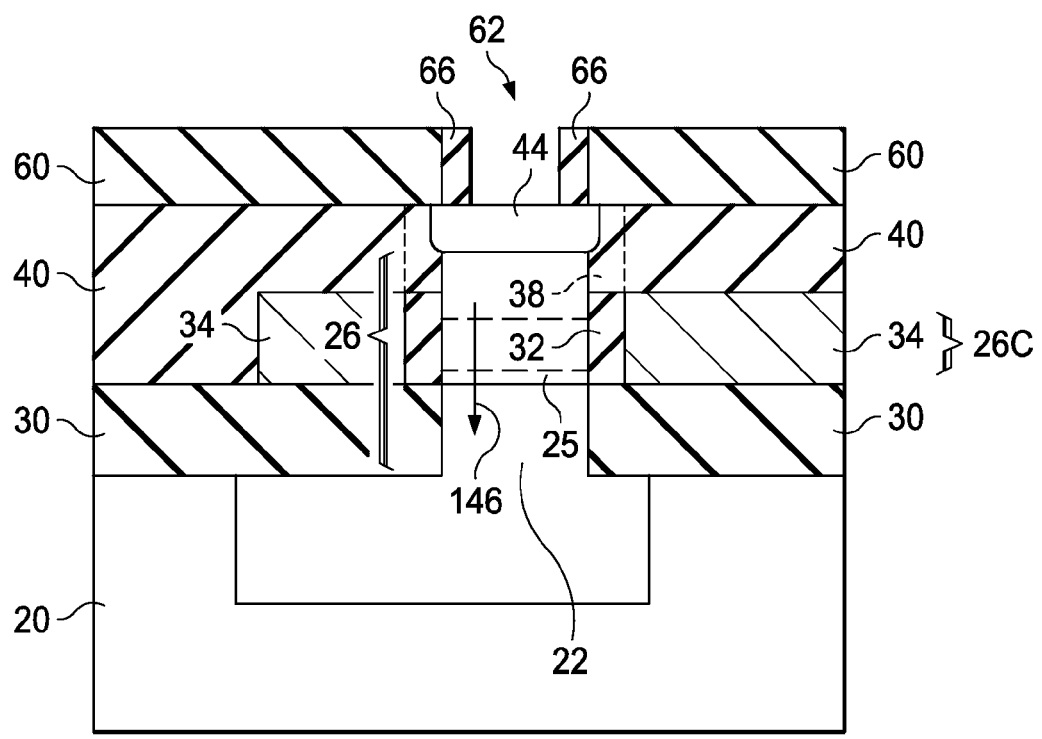
Figure 3G:
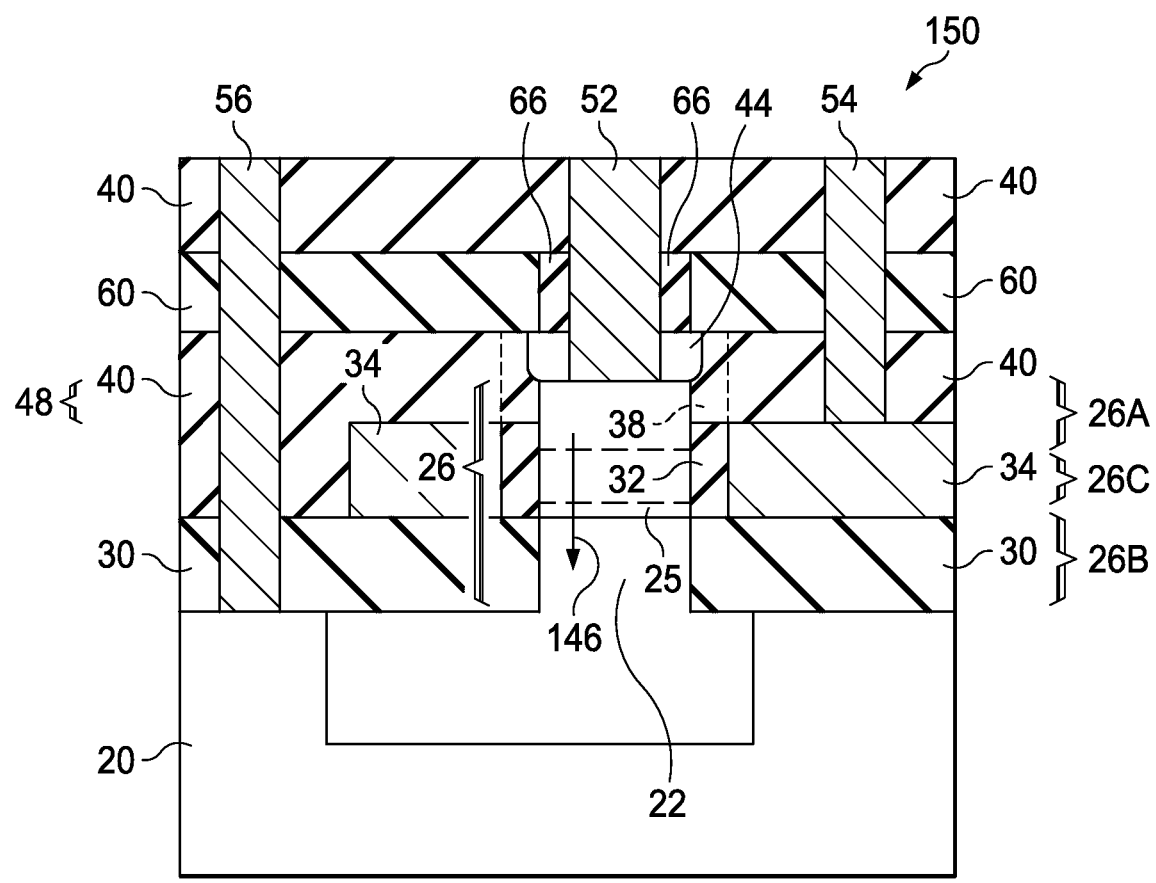

Next, as shown in FIG. 3F, a local oxidation is performed to oxidize the top portion of nano-wire 26. In some embodiments, the process conditions are chosen, so that an entirety of a top layer of nano-wire 26 is oxidized, and hence the edge portion of the resulting oxide region 44 extends beyond the respective sidewalls of nano-wire 26, and extends directly under hard mask 60. The edge portion of oxide region 44, which edge portion is overlapped by hard mask 60, may also have a ring shape. Due to the expansion in the volume of the oxidized portion of nano-wire 26, and further due to the fact the hard mask 60 suppresses the expansion in the volume, a compressive stress 146 is generated in nano-wire 26. After the local oxidation, the remaining components such as contact plugs 52, 54, and 56 are formed to finish the formation of PMOS transistor 150, as shown in FIG. 3G. In the resulting PMOS transistor 150, the remaining portion of oxide region 44 may also form a ring, with source/drain contact plug 52 extending through the oxide ring 44 to electrically couple to source/drain region 48.

Figure 4:
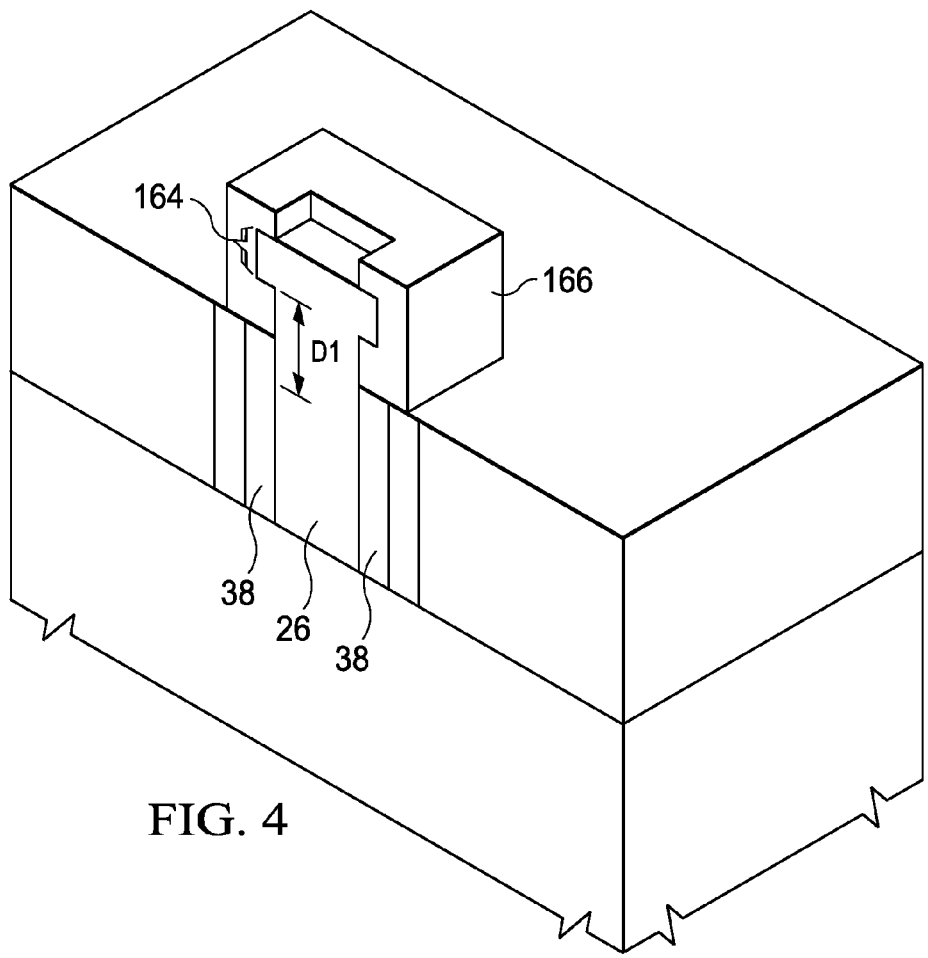
FIG. 4 illustrates a vertical NMOS structure that is used to simulate the stress in NMOS transistors.
Figure 5:
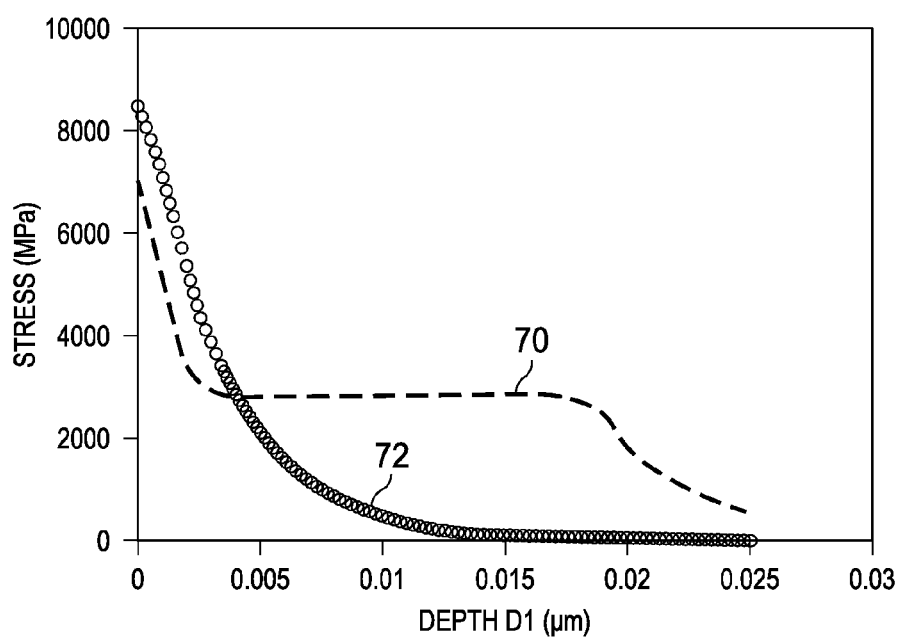
FIG. 5 illustrates the simulated stress in the vertical NMOS structure.

FIG. 4 illustrates a structure that is used to simulate the tensile stress generated in NMOS transistors 50 (FIGS. 1Q and 2G). In the simulated structure, semiconductor cap 164 is located over and connected to nano-wire 26. The oxidation of the outer portions of semiconductor cap 164 results in oxide region 166. Portions of oxide region 166 extend underlying and overlapped by the edge portions of semiconductor cap 164. The formation of oxide region 166 results in the expansion in volume of the oxidized portion of semiconductor cap 164, and hence a tensile stress is generated in nano-wire 26. The simulated result of the stress is shown as line 70 in FIG. 5, wherein the tensile stress in nano-wire 26 is illustrated as a function of distance D1 (FIG. 4), wherein distance D1 is measured from the bottom of semiconductor cap 164. The results indicated that the tensile stress may be as high as 8G Pascal, and the stress may remain high when distance D1 is smaller than about 0.02 μm. This means that the high tensile stress may be formed in the channel of vertical NMOS transistors as long as the distance of the channel from the bottom of semiconductor cap 164 is smaller than about 0.02 μm. Line 70 is simulated with low-viscosity layer 38 (FIG. 6) surrounding nano-wire 26. If low-viscosity layer 38 is replaced by hard silicon oxide, then the respective simulated result is shown as line 72. Compared to line 70, line 72 drops much faster than line 70 when distance D1 increases. This means that it is more difficult to generate a high tensile stress in the channel if low-viscosity layer 38 is not formed, unless the channel is formed very close to the bottom of semiconductor cap 164.

Figure 6:
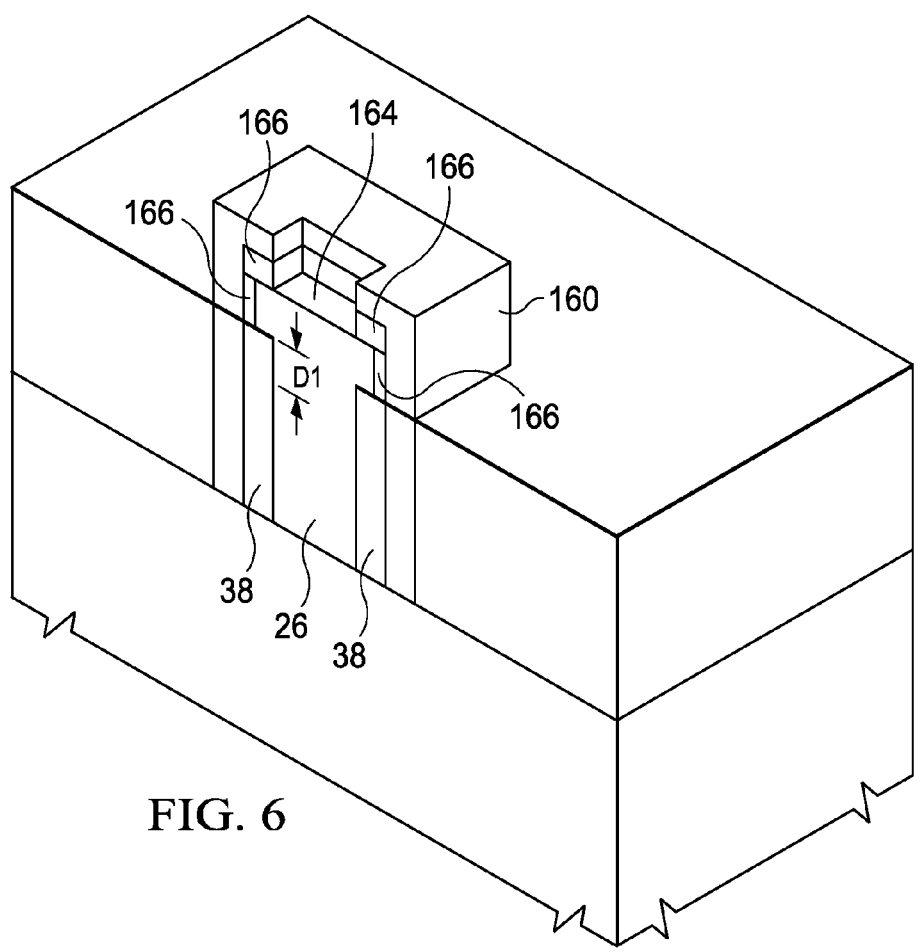
FIG. 6 illustrates a vertical PMOS structure that is used to simulate the stress in PMOS transistors.
Figure 7:
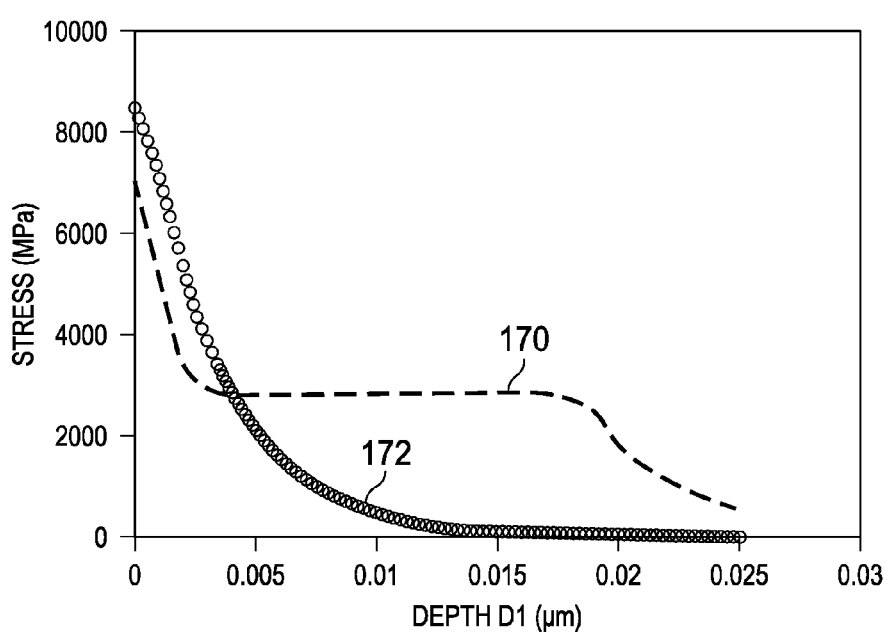
FIG. 7 illustrates the simulated stress in the vertical PMOS structure.

FIG. 6 illustrates a structure that is used to simulate the compressive stress generated in vertical PMOS transistor 150 (FIG. 3G). In the simulated structure, a semiconductor cap 164 is located over and connected to nano-wire 26. The oxidation of semiconductor cap 164 results in oxide region 166. Hard mask 160 is formed to suppress the volume expansion caused by the formation of oxide region 166, and hence a compressive stress is generated in nano-wire 26. The simulated result of the stress is shown as line 170 in FIG. 7, wherein the compressive stress in nano-wire 26 is illustrated as a function of the distance D1 (FIG. 6) from the bottom of semiconductor cap 164. The results also indicated that the compressive stress may be as high as −8G Pascal, and the stress may remain high when distance D1 is smaller than about 0.02 μm. This means that the high compress stress may be formed in the channel of the vertical PMOS transistor as long as the distance of the channel from the bottom of semiconductor cap 164 is smaller than about 0.02 μm. Furthermore, line 170 is simulated with low-viscosity layer 38 (FIG. 6) surrounding nano-wire 26. If low-viscosity layer 38 is replaced by silicon oxide, then the respective result is shown as line 172. Compared to line 170, line 172 drops much faster than line 170 when distance D1 increases. This means that it is more difficult to generate a high compressive stress in channel if low-viscosity layer 38 is not formed, unless the channel is formed very close to the bottom of semiconductor cap 164.

In accordance with some embodiments, the generated stress may be concentrated in the channel region by adopting a semiconductor material that has a low Young's modulus to form the channel region. For example, as shown in FIGS. 1Q, 2G, and 3G, the channel region may include portion 26C formed of substantially pure germanium or silicon germanium. The overlying portion 26A and underlying portion 26B of nano-wire 26 may be formed of silicon with no germanium comprised therein, or may be formed of silicon germanium, with the germanium concentration lower than in portion 26C.

Figure 8:
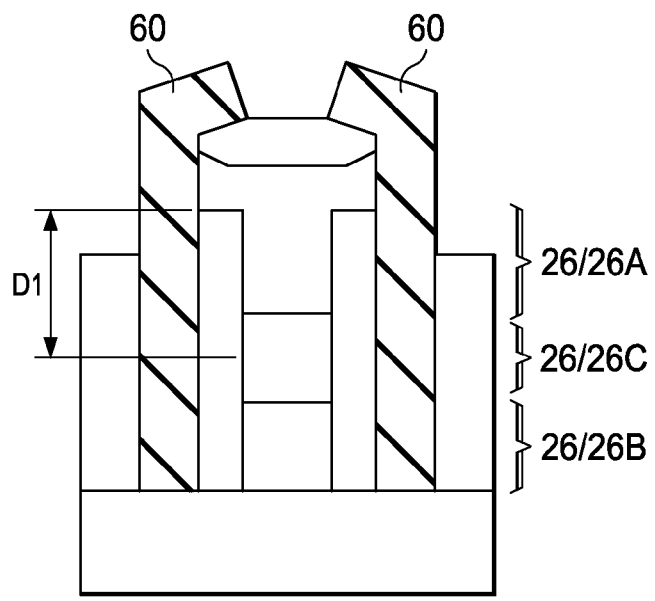
FIG. 8 illustrates stresses in a vertical transistor, which includes a germanium channel between two silicon regions.
Figure 9:
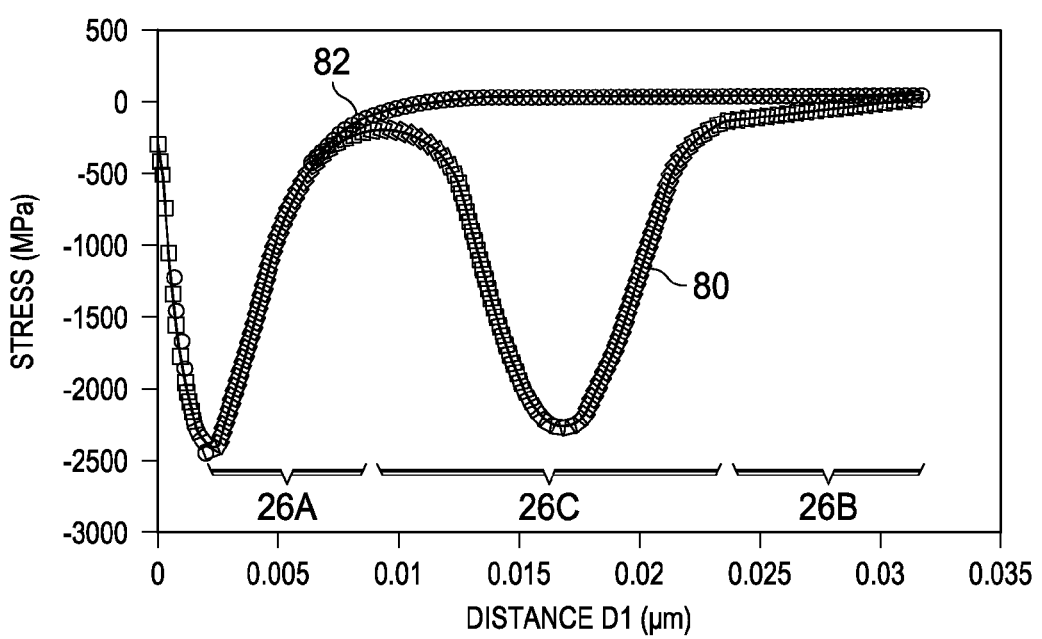
FIG. 9 illustrates the simulated stress in the vertical transistor shown in FIG. 8.

FIG. 8 illustrates a structure for simulating the concentration of the compressive stresses, wherein nano-wire portions 26A and 26B are silicon nano-wire portions, and portion 26C is a germanium nano-wire portion. The simulated stress is shown in FIG. 9. It is shown by line 80 that the stress in portion 26C is significantly greater than in neighboring portions 26A and 26B. As a comparison, if portions 26A, 26B, and 26C are all formed of silicon, then the simulated stress will be shown as line 82, which shows that the compressive stress in portion 26C is not greater than in portions 26A and 26B.

In accordance with some embodiments, a vertical MOS transistor includes a substrate and a nano-wire over the substrate. The nano-wire comprises a semiconductor material. An oxide ring extends from an outer sidewall of the nano-wire into the nano-wire, with a center portion of the nano-wire encircled by the oxide ring. The vertical MOS transistor further includes a gate dielectric encircling a portion of the nano-wire, a gate electrode encircling the gate dielectric, a first source/drain region underlying the gate electrode, and a second source/drain region overlying the gate electrode. The second source/drain region extends into the center portion of the nano-wire.

In accordance with other embodiments, a vertical MOS transistor includes a substrate, and a nano-wire over the substrate, wherein the nano-wire comprises a semiconductor material. A gate dielectric encircles a middle portion of the nano-wire, wherein the nano-wire has an upper portion over the middle portion. A gate electrode encircles the gate dielectric. An oxide ring extends from an outer sidewall of the upper portion of the nano-wire into the nano-wire, wherein the upper portion of the nano-wire further comprises a first portion over the oxide ring, a second portion underlying the oxide ring, and a third portion encircled by the oxide ring. A first source/drain region is underlying the gate electrode. A second source/drain region is overlying the gate electrode, wherein the second source/drain region extends into the center portion of the nano-wire.

In accordance with yet other embodiments, a vertical MOS transistor includes a substrate and a nano-wire over the substrate, wherein the nano-wire comprises a semiconductor material. A gate dielectric encircles a middle portion of the nano-wire, with an upper portion of the nano-wire over the middle portion. A gate electrode encircles the gate dielectric. An oxide region has a portion overlapping the nano-wire. A hard mask is over the oxide region, with an opening in the hard mask and overlapping the nano-wire, wherein at least an edge portion of the oxide region is overlapped by the hard mask. A first source/drain region is underlying the gate electrode. A second source/drain region is overlying the gate electrode, wherein the second source/drain region has a part in the nano-wire.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A vertical Metal-Oxide-Semiconductor (MOS) transistor comprising:
   a substrate;
   a nano-wire over the substrate, wherein the nano-wire comprises a semiconductor material;
   an oxide ring penetrating from an outer sidewall of the nano-wire into the nano-wire, with a center portion of the nano-wire being located between two portions of the oxide ring;
   a gate dielectric comprising portions on opposite sides of a portion of the nano-wire;
   a gate electrode comprising portions on opposite sides of the gate dielectric;
   a first source/drain region lower than the gate electrode; and
   a second source/drain region higher than the gate electrode.

2. The MOS transistor of claim 1 further comprising a low-viscosity dielectric material forming a ring comprising portions on opposite sides of a portion of the nano-wire, wherein the low-viscosity dielectric material has a softening temperature lower than a softening temperature of silicon dioxide.

3. The MOS transistor of claim 2, wherein the low-viscosity dielectric material is selected from the group consisting essentially of Boron-Doped Phospho-Silicate Glass (BPSG) and silicon germanium oxide.

4. The MOS transistor of claim 1, wherein the nano-wire comprises a top portion over the oxide ring, wherein a bottom surface of the top portion of the nano-wire is in contact with a top surface of the oxide ring, and wherein the second source/drain region comprises a top portion of the nano-wire.

5. The MOS transistor of claim 1, wherein the oxide ring has a top surface substantially level with a top surface of the nano-wire, and wherein the MOS transistor further comprises a non-permeable ring encircling a portion of the nano-wire over the gate electrode.

6. The MOS transistor of claim 1, wherein the oxide ring has a top surface substantially level with a top surface of the nano-wire, wherein the MOS transistor further comprises a hard mask layer, with an opening in the hard mask layer and overlapping the nano-wire, and wherein outer portions of the oxide ring is overlapped by a portion of the hard mask.

7. The MOS transistor of claim 1, wherein the nano-wire comprises:
   a first semiconductor layer between two portions of the gate dielectric, wherein the first semiconductor layer has a first Young's modulus;
   a second semiconductor layer over the first semiconductor layer; and
   a third semiconductor layer under the first semiconductor layer, wherein the second and the third semiconductor layers have second Young's modulus higher than the first Young's modulus.

8. A vertical Metal-Oxide-Semiconductor (MOS) transistor comprising:
   a substrate;
   a nano-wire over the substrate, wherein the nano-wire comprises a semiconductor material;
   a gate dielectric comprising portions on opposite sides of a middle portion of the nano-wire, wherein the nano-wire comprises an upper portion over the middle portion;
   a gate electrode encircling the gate dielectric;
   an oxide ring penetrating from an outer sidewall of the upper portion of the nano-wire into the nano-wire, wherein the upper portion of the nano-wire further comprises a first portion higher than the oxide ring, a second portion lower than the oxide ring, and a third portion between two opposite portions of the oxide ring;
   a first source/drain region lower than the gate electrode; and
   a second source/drain region higher than the gate electrode, wherein the second source/drain region extends into the upper portion of the nano-wire.

9. The MOS transistor of claim 8, wherein the middle portion of the nano-wire has a tensile stress, with the stress in a longitudinal direction of the nano-wire.

10. The MOS transistor of claim 8 further comprising a low-viscosity dielectric ring over the gate electrode and under the oxide ring, wherein the low-viscosity dielectric ring comprises portions on opposite sides of the nano-wire, and has a top end contacting the oxide ring, and wherein the low-viscosity dielectric ring has a melting temperature lower than a melting temperature of silicon dioxide.

11. The MOS transistor of claim 10, wherein the low-viscosity dielectric ring comprises a material selected from the group consisting essentially of Boron-Doped Phospho-Silicate Glass (BPSG) and silicon germanium oxide.

12. The MOS transistor of claim 10, wherein the low-viscosity dielectric ring comprises a bottom end in contact with at least one of the gate dielectric and the gate electrode.

13. The MOS transistor of claim 8 further comprising a non-permeable ring over and contacting the oxide ring, wherein the non-permeable ring comprises portions on opposite sides of the nano-wire, and has a top end substantially level with a top surface of the nano-wire.

14. The MOS transistor of claim 8, wherein the nano-wire comprises:
   a first semiconductor layer between two portions of the gate dielectric, wherein the first semiconductor layer has a first Young's modulus;
   a second semiconductor layer over the first semiconductor layer; and
   a third semiconductor layer under the first semiconductor layer, wherein the second and the third semiconductor layers have second Young's modulus higher than the first Young's modulus.

15. The MOS transistor of claim 14, wherein the first semiconductor layer comprises a germanium layer, and the second and the third semiconductor layers comprise silicon and have a smaller germanium percentage than the first semiconductor layer.

16. The MOS transistor of claim 8, wherein the third portion of the upper portion of the nano-wire has a horizontal width smaller than horizontal widths of the first portion the second portion of the upper portion of the nano-wire.

17. A vertical Metal-Oxide-Semiconductor (MOS) transistor comprising:
   a substrate;
   a first source/drain region having a portion in the substrate;
   a nano-wire over the substrate, wherein the nano-wire forms a channel region of the MOS transistor;
   a gate dielectric encircling the nano-wire;
   a gate electrode encircling the gate dielectric;
   a second source/drain region comprising a top portion of the nano-wire; and
   a dielectric region extending from an outer sidewall of the second source/drain region into the second source/drain region, wherein the second source/drain region comprises:

a first portion underlying the dielectric region;

a second portion level with the dielectric region; and a third portion overlying the dielectric region, wherein a first horizontal dimension of the second portion is smaller than second horizontal dimensions of the first portion and the third portion.

18. The MOS transistor of claim 17, wherein the dielectric region forms a ring encircling the second portion.

19. The MOS transistor of claim 17, wherein portions of the dielectric region overlapped by the first portion form a ring.

* * * * *